US012812960B2

(12) United States Patent
Chiang et al.

(10) Patent No.: US 12,812,960 B2
(45) Date of Patent: Nov. 24, 2026

(54) METHODS FOR FORMING ISOLATION STRUCTURES

(71) Applicant: Taiwan Semiconductor Manufacturing Company, Ltd., Hsin-Chu (TW)

(72) Inventors: Hsin-Che Chiang, Taipei City (TW); Jyun-Hong Huang, Hsinchu City (TW); Chi-Wei Wu, Hsinchu City (TW); Shu-Hui Wang, Hsinchu City (TW); Jeng-Ya Yeh, New Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1030 days.

(21) Appl. No.: 17/881,430

(22) Filed: Aug. 4, 2022

(65) Prior Publication Data

US 2024/0047273 A1 Feb. 8, 2024

(51) Int. Cl.

| | |
|---|---|
| ***H10D 84/03*** | (2025.01) |
| ***H10D 84/01*** | (2026.01) |
| ***H10D 84/83*** | (2025.01) |
| ***H10W 10/00*** | (2026.01) |
| ***H10W 10/17*** | (2026.01) |

(52) U.S. Cl.

CPC ....... *H10D 84/038* (2025.01); *H10D 84/0135* (2025.01); *H10D 84/0151* (2025.01); *H10D 84/0158* (2025.01); *H10D 84/834* (2025.01); *H10W 10/014* (2026.01); *H10W 10/17* (2026.01)

(58) Field of Classification Search

CPC ........ H01L 21/31055; H01L 21/76224; H10D 84/0151; H10D 84/038; H10D 84/0135; H10D 84/0158; H10D 84/834; H10W 10/014; H10W 10/17

See application file for complete search history.

(56) References Cited

U.S. PATENT DOCUMENTS 10,269,787 B2 * 4/2019 Wang .................. H10D 64/667
10,978,351 B2 4/2021 Wen et al.
(Continued)

OTHER PUBLICATIONS

Dong, Etch Back Before ILD-CMP for Improving the Loading Issue After ILD-CMP, 2021 (Year: 2021).*

*Primary Examiner* — Britt Hanley
*Assistant Examiner* — Casey Paul Boatman
(74) *Attorney, Agent, or Firm* — HAYNES AND BOONE, LLP

(57) ABSTRACT

Semiconductor structures and methods are provided. An exemplary method according to the present disclosure includes receiving a workpiece including a first semiconductor fin and a second semiconductor fin penetrating from a substrate and separated by a first isolation feature, and a gate structure intersecting the first semiconductor fin and the second semiconductor fin. The method also includes removing the gate structure and portions of the first semiconductor fin, the second semiconductor fin, and the first isolation feature disposed directly under the gate structure to form a fin isolation trench, forming a dielectric layer over the workpiece to substantially fill the fin isolation trench, and planarizing the dielectric layer to form a fin isolation structure in the fin isolation trench.

20 Claims, 20 Drawing Sheets

(56) References Cited

U.S. PATENT DOCUMENTS

| | | | |
|---|---|---|---|
| 11,043,595 B2 | 6/2021 | Su et al. | |
| 11,121,036 B2 | 9/2021 | Ching et al. | |
| 11,374,104 B2 | 6/2022 | Chen et al. | |
| 2020/0006557 A1* | 1/2020 | Ko | H10D 30/792 |
| 2020/0044070 A1* | 2/2020 | Wang | H10D 30/62 |
| 2020/0135575 A1* | 4/2020 | Greene | H10D 84/038 |
| 2022/0230926 A1* | 7/2022 | Huang | H10D 84/0158 |

* cited by examiner

METHODS FOR FORMING ISOLATION STRUCTURES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, various methods have been developed to form isolation structures to divide active regions into segments. While existing isolation structures are generally adequate in isolating active region segments, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
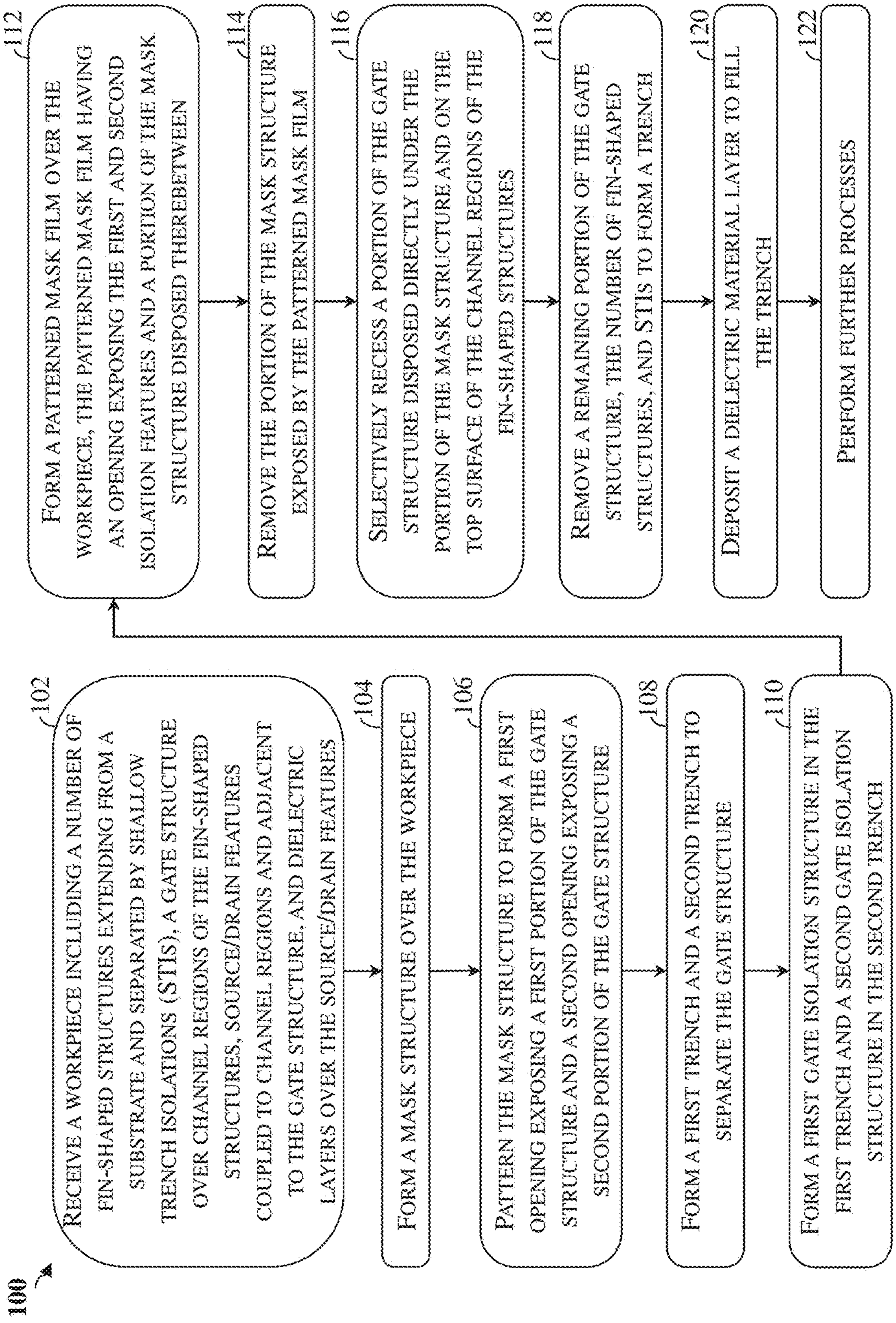
FIG. 1 illustrates a flowchart of an exemplary method for fabricating a semiconductor structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

Continuous poly on diffusion edge (CPODE) processes have been developed to form isolation structures (may be referred to as CPODE structures or dielectric gates) to divide active regions into segments. CPODE structures and other similar structures are a scaling tool to improve density of devices (e.g., transistors). To achieve desired scaling effect while maintaining the devices' proper functions (e.g., avoiding electrical shorting), the CPODE structures may be formed between boundaries of such devices (i.e., between, for example, source/drain contacts and/or source/drain features), such that the separation distance between adjacent devices may be reduced or minimized without compromising device performance. In some embodiments, a CPODE structure may be formed by forming a trench having multiple branches to separate multiple adjacent active regions into segments and then filling the trench ("CPODE trench") with dielectric material(s). For example, for a dual-fin device, its source/drain spans over two fin-shaped active regions. To isolate two adjacent dual-fin devices, the formation of the CPODE trench may include removing at least a part of a gate structure over shallow trench isolation (STI) features to form an upper portion of the CPODE trench and removing the channel regions thereunder to form branches as a lower portion of the CPODE trench. Those branches are separated by the STI features. As integrated circuit (IC) technologies progress towards smaller technology nodes, dimensions of channel regions decrease, leading to a high aspect ratio (i.e., a ratio of height to width) of the CPODE trench. Forming a CPODE trench with a high aspect ratio may disadvantageously increase, for example, etching difficulty and non-uniform etching depths for different active regions (and thus lead to undercut issues), and degrade the device's electrical performance (e.g., breakdown voltage). In some other existing technologies, forming the CPODE trench may disadvantageously etch neighboring gate structures and/or source/drain features.

The present disclosure is directed to methods of forming a CPODE structure with a reduced aspect ratio. In some embodiments, an exemplary method includes forming two gate isolations to cut a metal gate structure into three segments, performing a first etching process to selectively recess a middle one of the three segments intersecting two fin-shaped active regions to form a trench that exposes a top surface of a gate dielectric layer on the two fin-shaped active regions, and then performing a second etching process to vertically extend the trench downward to below a top surface of a substrate, thereby forming a CPODE trench. The second etching process not only removes the remaining portion of the middle one of the three segments, channel regions of the two fin-shaped active regions, but also removes STI features surrounding the two fin-shaped active regions. That is, an entirety of a bottom surface of the CPODE trench doesn't expose the STI features. Dielectric material(s) may be then deposited to fill the CPODE trench to form the CPODE structure. By removing the STI features to enlarge the bottom portion of the CPODE trench, the etching process window may be increased, the depth of the CPODE trench may be further increased to enhance the isolation between adjacent devices, and the discharge at sharp corners of the STI features may be advantageously reduced. Methods of the present disclosure may be applicable to form a CPODE structure to cut any suitable number of fin-shaped active regions.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2, 3A-5A, 3B-5B, 6, 7A-9A, 7B-9B, 10, 11A-16A, 11B-16B, 17, 18, 19A, 19B, 20, and 21 which are fragmentary cross-sectional views or top views of a workpiece 200 at different stages of fabrication according to embodiments of method 100. Method 100 is merely an example and is not intended to limit the present disclosure to what is explicitly illustrated therein. Additional steps may be provided before, during and after the method 100, and some steps described can be replaced, eliminated, or moved around for additional embodiments of the method. Not all steps are described herein in detail for reasons of simplicity. Because the workpiece 200 will be fabricated into a semiconductor structure 200 upon conclusion of the fabrication processes, the workpiece 200 may be referred to as the semiconductor structure 200 as the context requires. For avoidance of doubts, the X, Y and Z directions in the figures are perpendicular to one another and are used consistently. Throughout the present disclosure, like reference numerals denote like features unless otherwise excepted.

Referring to FIGS. 1, 2 and 3A-3B, method 100 includes a block 102 where a workpiece 200 is received. The workpiece 200 includes a substrate 202 (shown in FIGS. 3A-3B). In an embodiment, the substrate 202 is a bulk silicon substrate (i.e., including bulk single-crystalline silicon). The substrate 202 may include other semiconductor materials in various embodiments, such as germanium, silicon carbide, gallium arsenide, gallium phosphide, indium phosphide, indium arsenide, indium antimonide, SiGe, GaAsP, AlinAs, AlGaAs, GalnAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GOI) substrate, and includes a carrier, an insulator on the carrier, and a semiconductor layer on the insulator. The substrate 202 can include various doped regions (not shown) configured according to design requirements of semiconductor structure 200, such as p-type doped regions, n-type doped regions, or combinations thereof. P-type doped regions (for example, p-type wells) include p-type dopants, such as boron (B), gallium (Ga), other p-type dopant, or combinations thereof. N-type doped regions (for example, n-type wells) include n-type dopants, such as phosphorus (P), arsenic (As), other n-type dopant, or combinations thereof. In some implementations, the substrate 202 includes doped regions formed with a combination of p-type dopants and n-type dopants. An ion implantation process, a diffusion process, and/or other suitable doping process can be performed to form the various doped regions.

Figure 2:
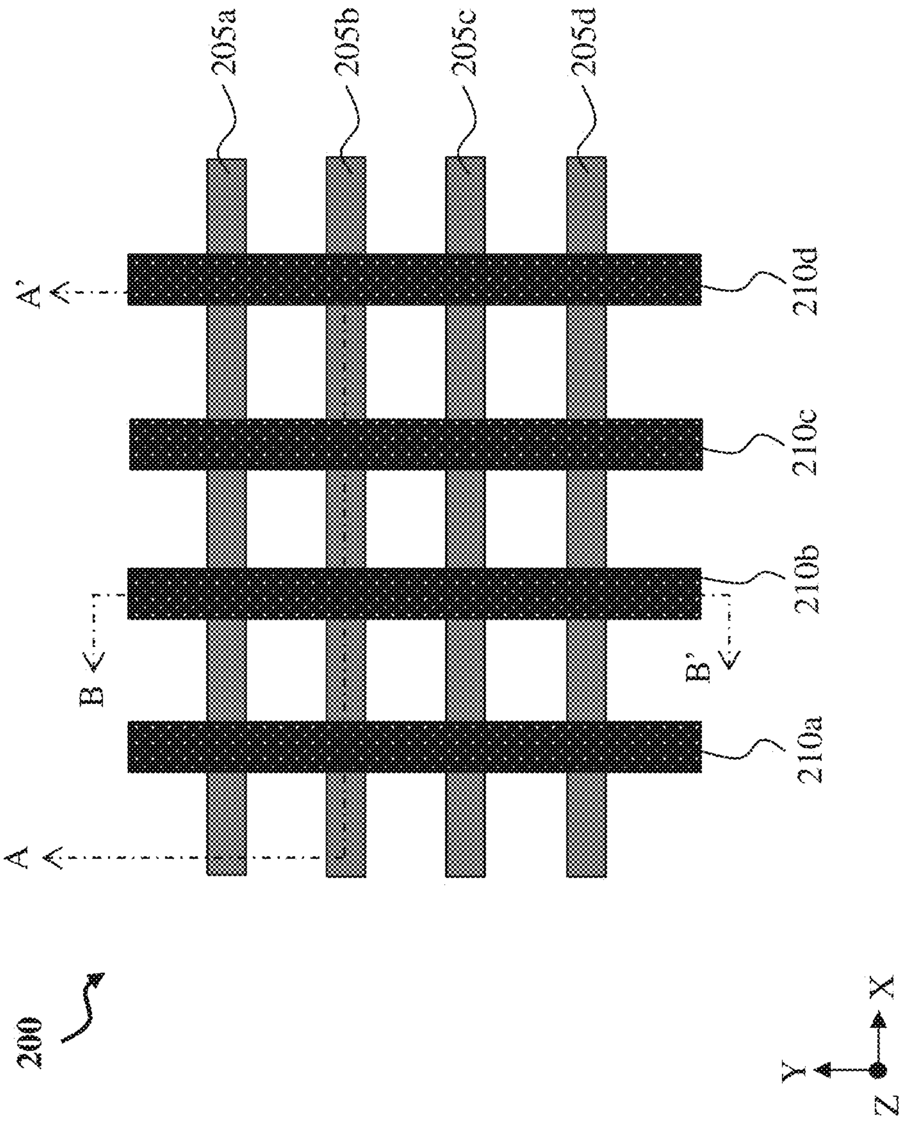
FIG. 2 illustrates a fragmentary top view of an exemplary workpiece to undergo various stages of operations in the methods of FIG. 1, according to various aspects of the present disclosure.

The workpiece 200 also includes multiple fin-shaped structures/fin-shaped active regions (such as fin-shaped structures 205*a*, 205*b*, 205*c*, 205*d*) disposed on the substrate 202. The number of fin-shaped structures 205*a*-205*d* shown in FIG. 2 is just an example. The workpiece 200 may include any suitable number of fin-shaped structures. In some embodiments, the fin-shaped structures 205*a*-205*d* may be formed from patterning a top portion 202*t* of the substrate 202. Each of the fin-shaped structures 205*a*-205*d* vertically protrudes along the Z direction, extends in an elongated manner along the X direction, and are separated from one another along the Y direction, as shown in FIG. 2. In the present embodiments, the fin-shaped structures 205*a*-205*d* may include a uniform semiconductor composition along the Z axis and a final structure of the workpiece 200 includes FinFETs. In some alternative embodiments not explicitly shown in the figures, the workpiece 200 may be fabricated to form MBC transistors and the fin-shaped structures 205*a*-205*d* may include at least one nanostructure of an MBC transistor. The fin-shaped structures 205*a*-205*d* may be formed from patterning one or more epitaxial layers (e.g., a vertical stack of alternating channel layers and sacrificial layers) deposited over the substrate 202. The channel layers and sacrificial layers have different compositions. The sacrificial layers in the channel regions of fin-shaped structures are then selectively removed to release the channel layers into suspended nanostructures to forming a channel region.

Figure 3B:
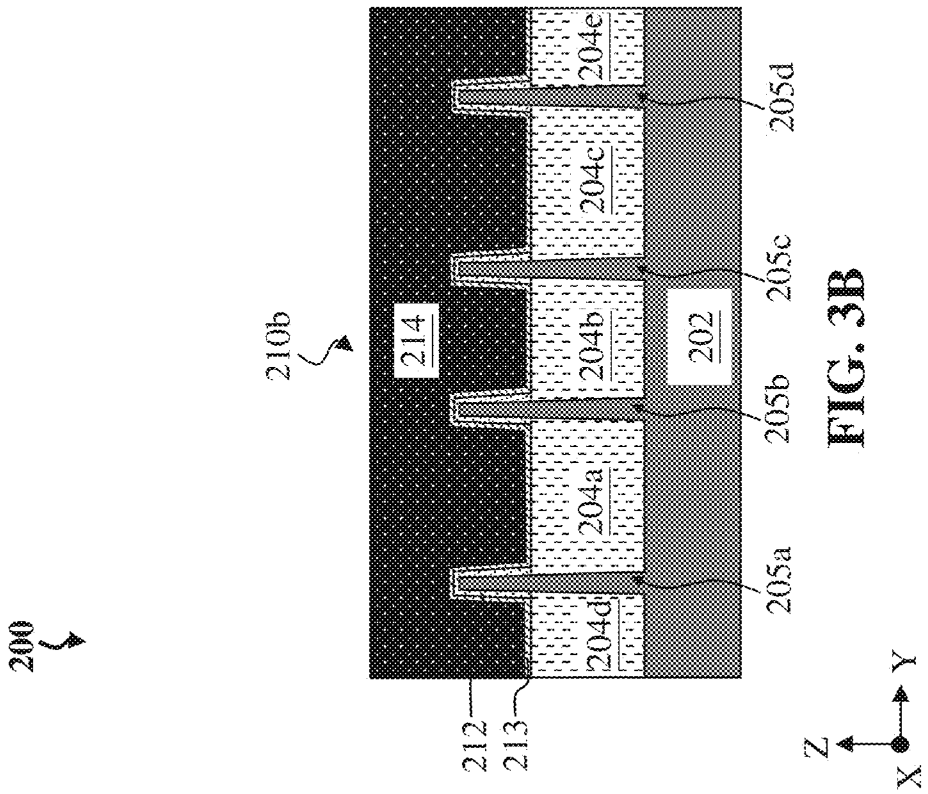
FIGS. 3B, 4B, 5B, 7B, 8B, 9B, 11B, 12B, 13B, 14B, 15B, 16B, and 19B illustrate fragmentary cross-sectional views of the workpiece taken along line B-B' as shown in FIG. 2 during various fabrication stages in the method of FIG. 1, according to various aspects of the present disclosure.
Figure 3A:
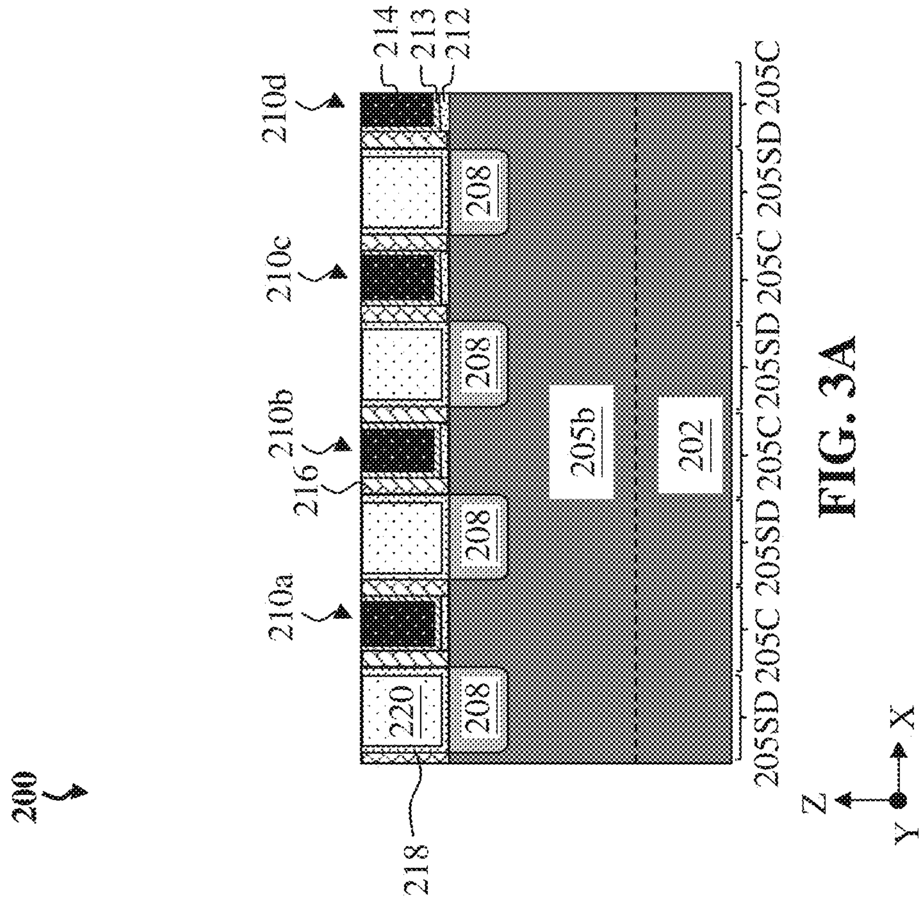
FIGS. 3A, 4A, 5A, 7A, 8A, 9A, 11A, 12A, 13A, 14A, 15A, 16A, and 19A illustrate fragmentary cross-sectional views of the workpiece taken along line A-A' as shown in FIG. 2 during various fabrication stages in the method of FIG. 1, according to various aspects of the present disclosure.

As represented in FIG. 3A, each of the fin-shaped structures 205*a*-205*d* includes channel regions 205C and source/drain regions 205SD. Each channel region 205C is wrapped over by and underlies a gate structure while the source/drain region 205SD is not overlapped by a gate structure. As will be described further below, source/drain features 208 are to be formed in the source/drain region 205SD. Source/drain feature(s) 208 may refer to a source or a drain, individually or collectively dependent upon the context.

The workpiece 200 also includes a number of isolation features (such as isolation features 204*a*, 204*b*, 204*c*, 204*d*, 204*e* shown in FIG. 3B) formed around the fin-shaped structures 205*a*-205*b* to isolate two adjacent fin-shaped structures. The isolation features 204*a*-204*e* may also be referred to as shallow trench isolation (STI) features. In some embodiments, the STI features 204*a*-204*e* may include silicon oxide, silicon oxynitride, fluorine-doped silicate glass (FSG), a low-k dielectric, combinations thereof, and/or other suitable materials.

As represented in FIGS. 2 and 3A, the workpiece 200 also includes source/drain features 208 formed in and/or over source/drain regions 205SD and coupled to the channel regions 205C. Depending on the conductivity type of the to-be-formed transistor, the source/drain features 208 may be n-type source/drain features or p-type source/drain features. Exemplary n-type source/drain features may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Still referring to FIGS. 2 and 3A-3B, the workpiece 200 includes gate structures (e.g., gate structures 210*a*, 210*b*, 210*c*, 210*d*) disposed over channel regions 205C of the fin-shaped structures 205*a*-205*d*. In the embodiments represented in FIG. 2 and FIG. 3B, the gate structure 210*b* wraps over channel regions of the fin-shaped structures 205*a*-205*d*. Each of the gate structures 210*a*-210*d* includes a gate dielectric layer and a gate electrode 214 over the gate dielectric layer. The gate dielectric layer includes an interfacial layer 212 and a high-k dielectric layer 213. In some instances, the interfacial layer 212 may be formed by thermal oxidation and may include silicon oxide. The high-k dielectric layer 213 is formed of dielectric materials having a high dielectric constant, for example, greater than a dielectric constant of silicon oxide (k≈3.9). Exemplary high-k dielectric materials for the high-k dielectric layer include hafnium oxide, titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr) $TiO_3$ (BST), silicon nitride (SiN), silicon oxynitride (SiON), combinations thereof, or other suitable materials. In one embodiment, the high-k dielectric layer 213 is formed of hafnium oxide (HfO). The gate electrode 214 may include multiple layers, such as work function layers, glue/barrier layers, and/or metal fill (or bulk) layers. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as aluminum (Al), copper (Cu), tungsten (W), ruthenium (Ru), titanium (Ti), a suitable metal, or a combination thereof. Sidewalls of the gate structures 210*a*-210*d* are lined with gate spacers 216. In some embodiments, the gate spacers 216 may include silicon carbonitride, silicon oxycarbide, silicon oxycarbonitride, or silicon nitride.

Still referring to FIG. 3A, the workpiece 200 also includes a contact etch stop layer (CESL) 218 and an interlayer dielectric (ILD) layer 220 deposited over the source/drain features 208. The CESL 218 is configured to protect the various underlying components during subsequent fabrication processes and may include silicon nitride, silicon oxynitride, and/or other suitable materials and may be formed by atomic layer deposition (ALD), chemical vapor deposition (CVD), plasma-enhanced chemical vapor deposition (PECVD) process and/or other suitable deposition or oxidation processes. As shown in FIG. 3A, the CESL 218 may be deposited on top surfaces of the source/drain features 208 and sidewalls of the gate spacer 216. The ILD layer 220 is deposited by a CVD process, a PECVD process or other suitable deposition technique over the workpiece 200 after the deposition of the CESL 218. The ILD layer 220 may include silicon oxide, a low-k dielectric material, tetraethyl orthosilicate (TEOS), doped silicon oxide (e.g., borophosphosilicate glass (BPSG), fluorosilicate glass (FSG), phosphosilicate glass (PSG)), other suitable dielectric materials, or combinations thereof. One or more chemical mechanical planarization (CMP) processes may be performed to planarize the top surface of the workpiece 200 after the deposition of the ILD layer 220.

In some embodiments, a gate replacement process (or gate-last process) may be adopted where some of dummy gate stacks (not shown) serve as placeholders for those functional gate structures 210a-210d. In an example gate last process, dummy gate stacks (not shown) are formed over channel regions of the fin-shaped structures 205a-205b. Each dummy gate stacks may include a gate dielectric layer (e.g., $SiO_2$) and a dummy gate electrode layer (e.g., polysilicon) formed thereon. The gate spacers 216 are then deposited over the workpiece 200, including over sidewalls of the dummy gate stacks. Source/drain features 208 may be formed after the forming of the dummy gate stacks. After forming the CESL 218 and the ILD layer 220, a planarization process, such as a CMP process, may be performed to remove excess materials to expose the dummy gate stacks. The dummy gate stacks are then removed and replaced with the gate structures 210a-210d, the composition of which has been described above.

Figure 4B:
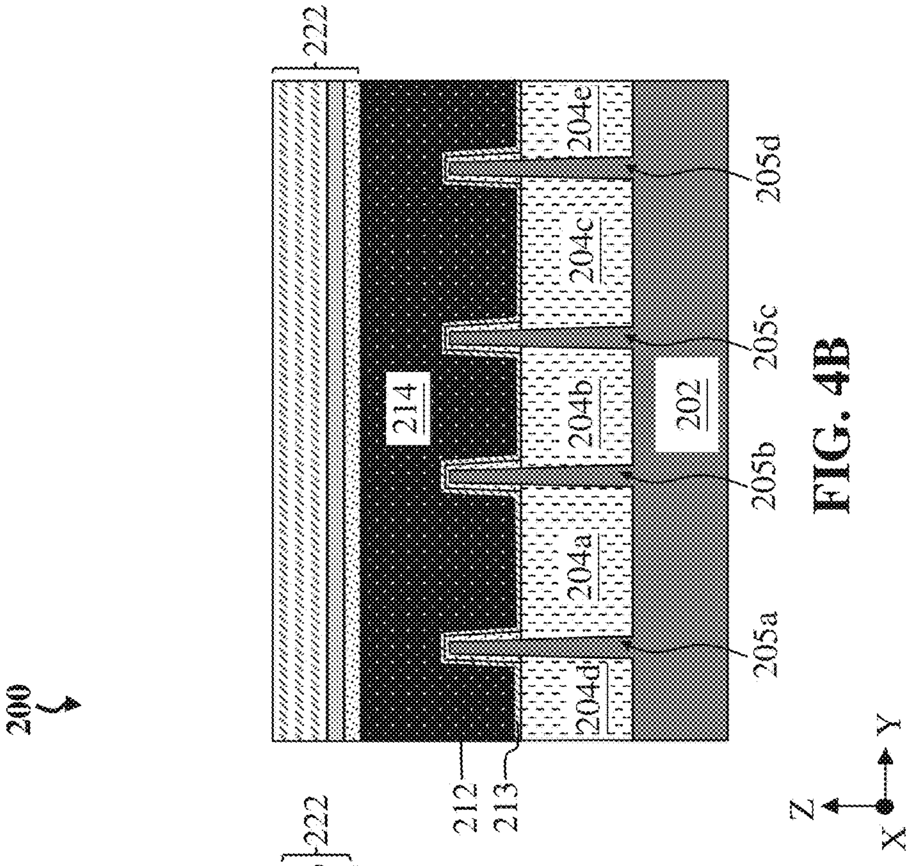
Figure 4A:
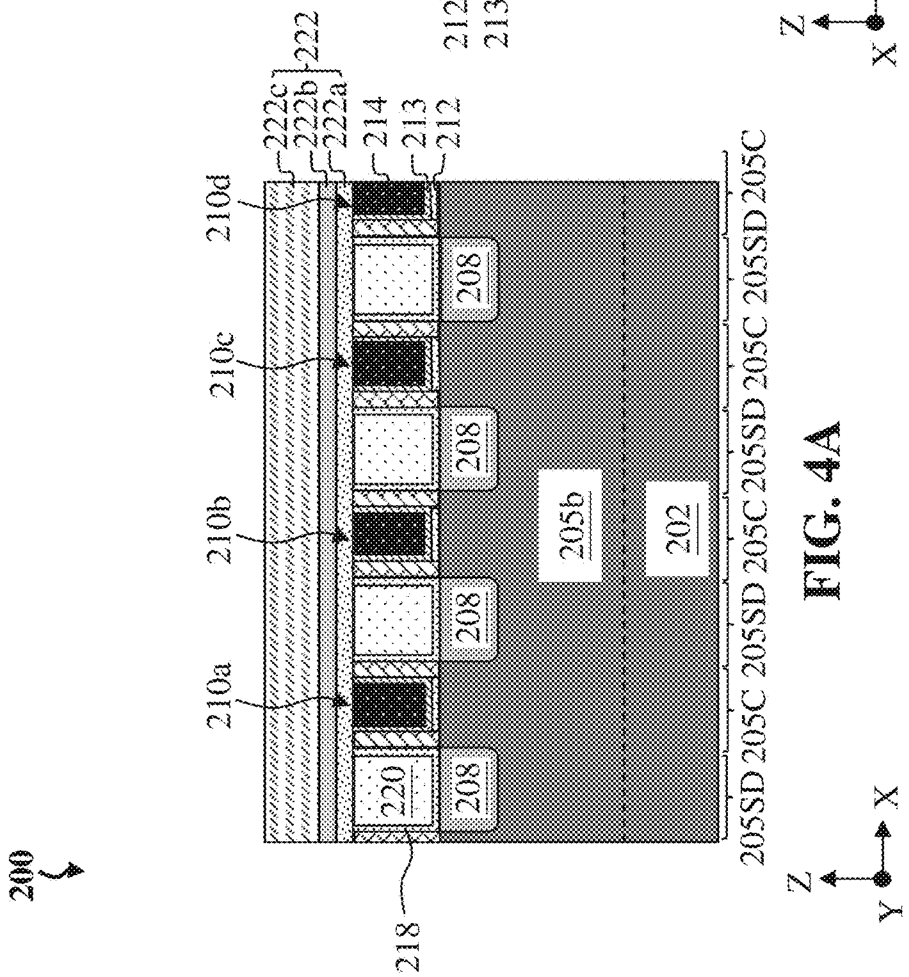
Figure 5B:
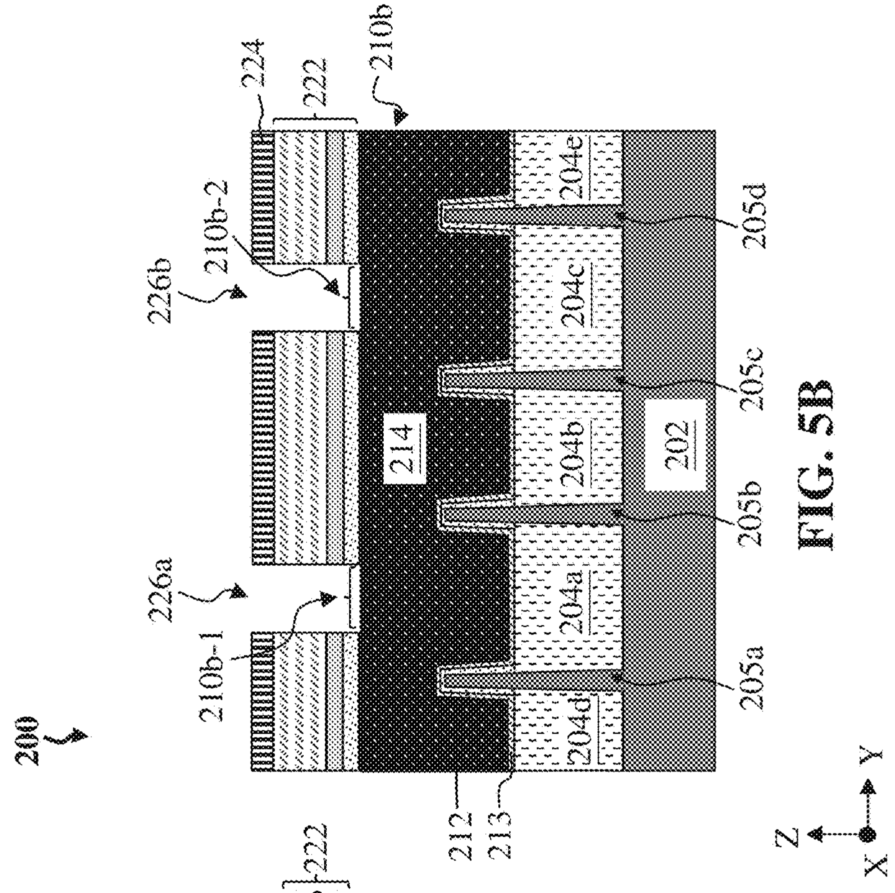
Figure 5A:
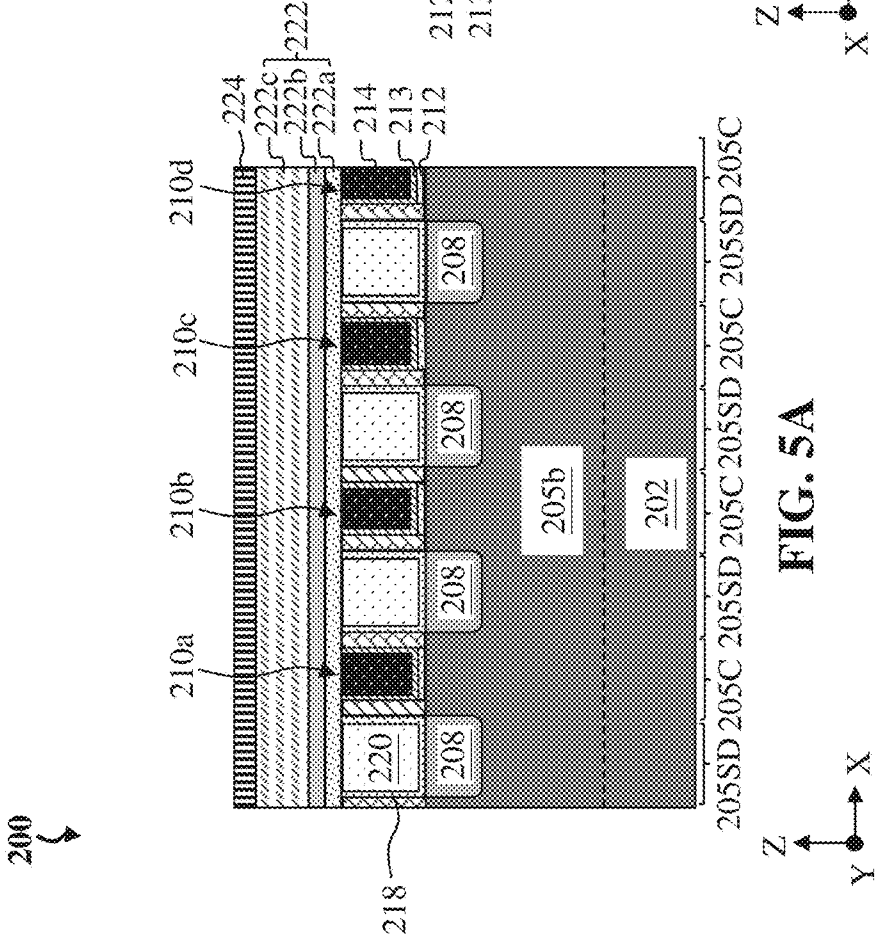

Referring to FIGS. 1, 4A, and 4B, method 100 includes a block 104 where a mask structure 222 is formed over the workpiece 200. In the present embodiments, the mask structure 222 is a multi-layer structure and includes a first layer 222a formed directly on the ILD layer 220 and the gate structures 210a-210d, a second layer 222b formed directly on the first layer 222a, and a third layer 222c formed over the second layer 222b. The first layer 222a may include aluminum oxide, silicon oxide, silicon nitride, silicon carbonitride, silicon oxycarbide, silicon oxynitride, silicon oxycarbonitride, other suitable materials, or combinations thereof, and may be formed by CVD, ALD, PVD (physical vapor deposition), other suitable methods, or combinations thereof. The second layer 222b may be formed of a material that is different than that of the first layer 222a to provide an end point signal for a subsequent planarization process (e.g., one or more CMP processes). The third layer 222c may include aluminum oxide, silicon oxide, silicon nitride, silicon carbonitride, silicon oxycarbide, silicon oxynitride, silicon oxycarbonitride, other suitable materials, or combinations thereof, and may be formed by CVD, ALD, PVD, other suitable methods, or combinations thereof. In an embodiment, the first layer 222a is formed of silicon nitride, the second layer 222b is formed of silicon (Si), and the third layer 222c is formed of silicon nitride and functions as a hard mask.

Figure 6:
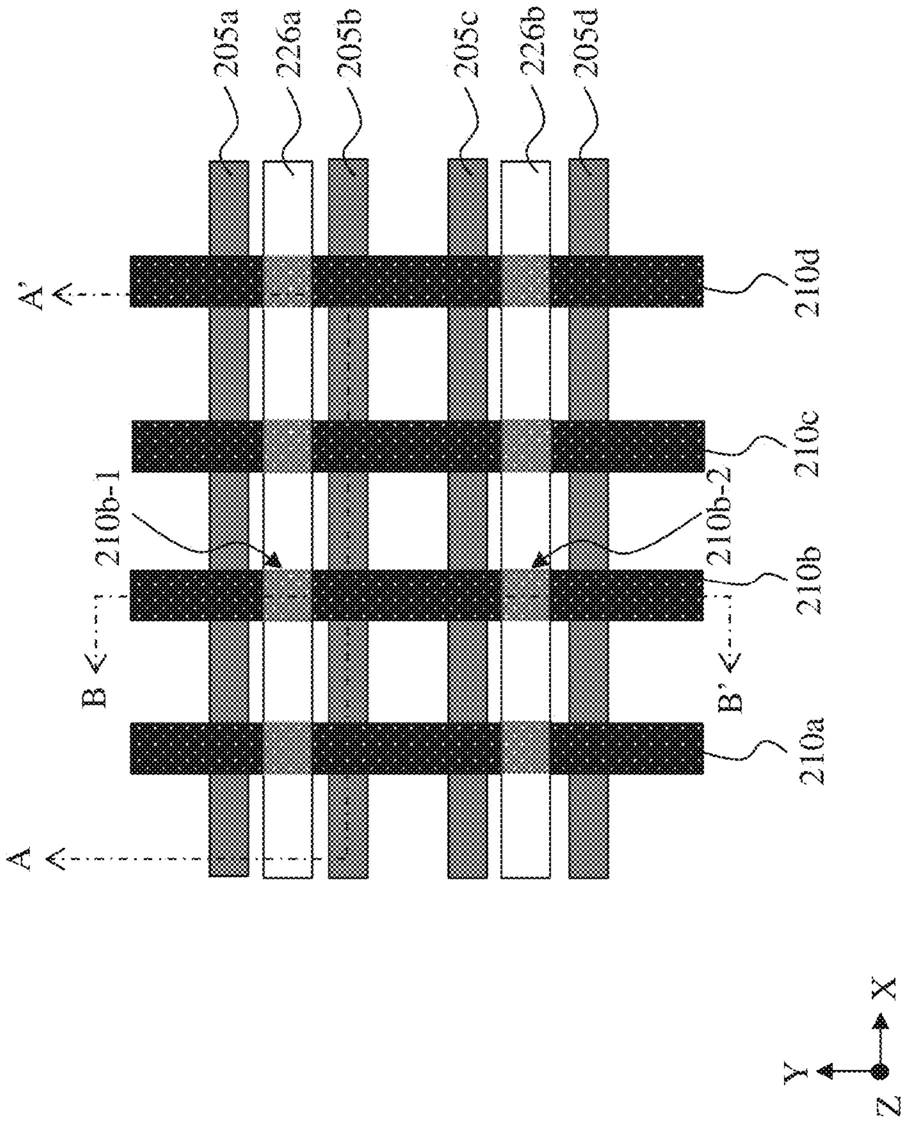
FIG. 6 illustrates a fragmentary top view of an exemplary semiconductor structure shown in FIGS. 5A-5B, according to various embodiments of the present disclosure.

Referring to FIGS. 1, 5A, 5B and 6, method 100 includes a block 106 where the mask structure 222 is patterned to form a first opening 226a and a second opening 226b. The patterning of the mask structure 222 may include multiple processes. For example, a masking element 224 including a photoresist layer may be formed over the mask structure 222, exposed to a radiation source through a patterned mask, and subsequently developed to form a patterned masking element 224. The mask structure 222 may then be etched using the patterned masking element 224 as an etch mask to form the first opening 226a exposing a first portion 210b-1 of the gate structure 210b and the second opening 226b exposing a second portion 210b-2 of the gate structure 210b. The patterned masking element 224 may be removed after forming the first opening 226a and the second opening 226b. FIG. 6 depicts a fragmentary top view of the workpiece 200 after forming the first openings 226a and the second opening 226b. In embodiments represented in FIG. 6, the first opening 226a also exposes portions of the gate structures 210a, 210c, and 210d that align with the first portion 210b-1 of the gate structure 210b along the X direction, and the second opening 226b also exposes portions of the gate structures 210a, 210c, and 210d that align with the second portion 210b-2 of the gate structure 210b along the X direction.

Figure 7A:
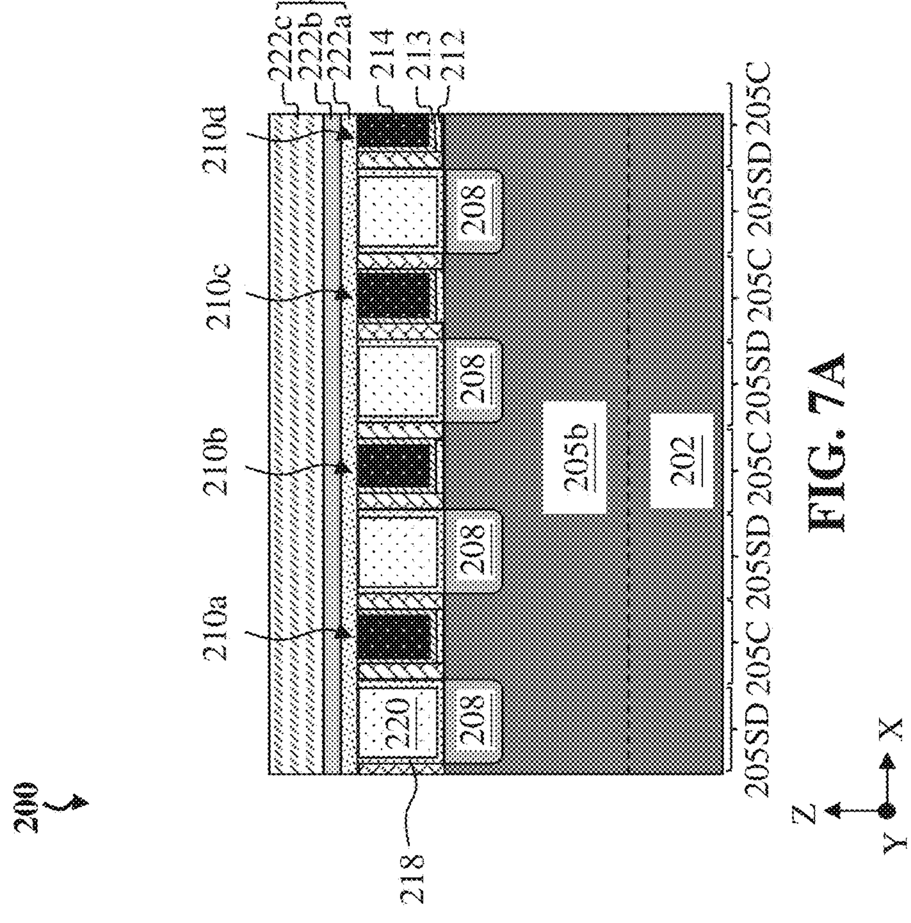
Figure 7B:
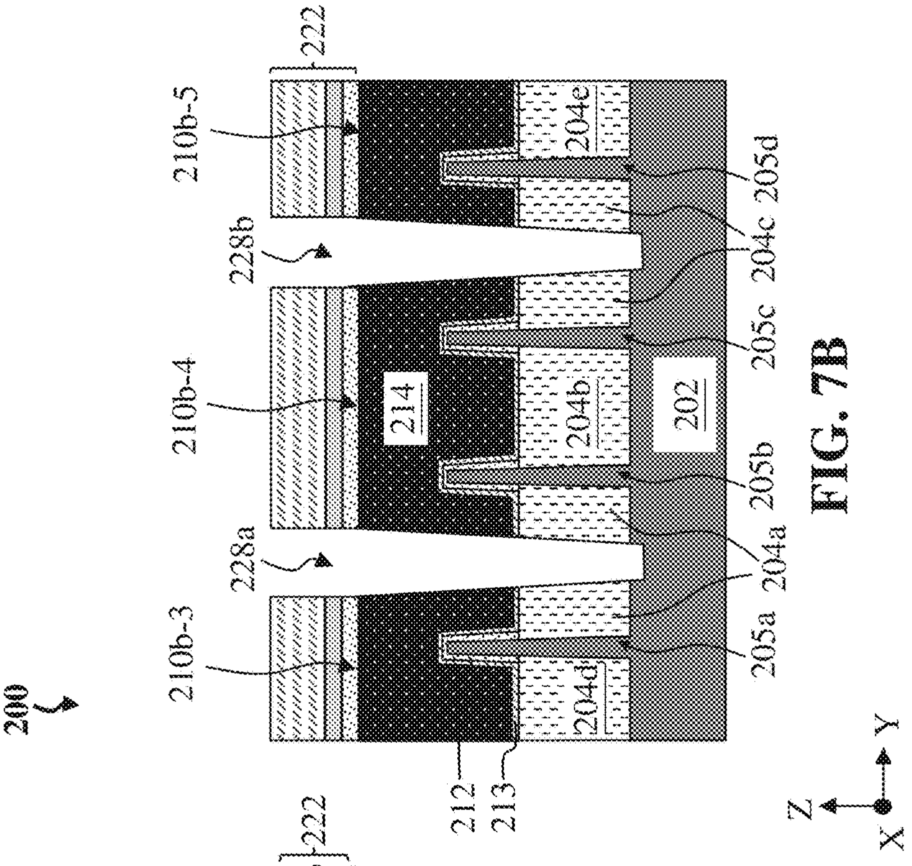
Figure 8A:
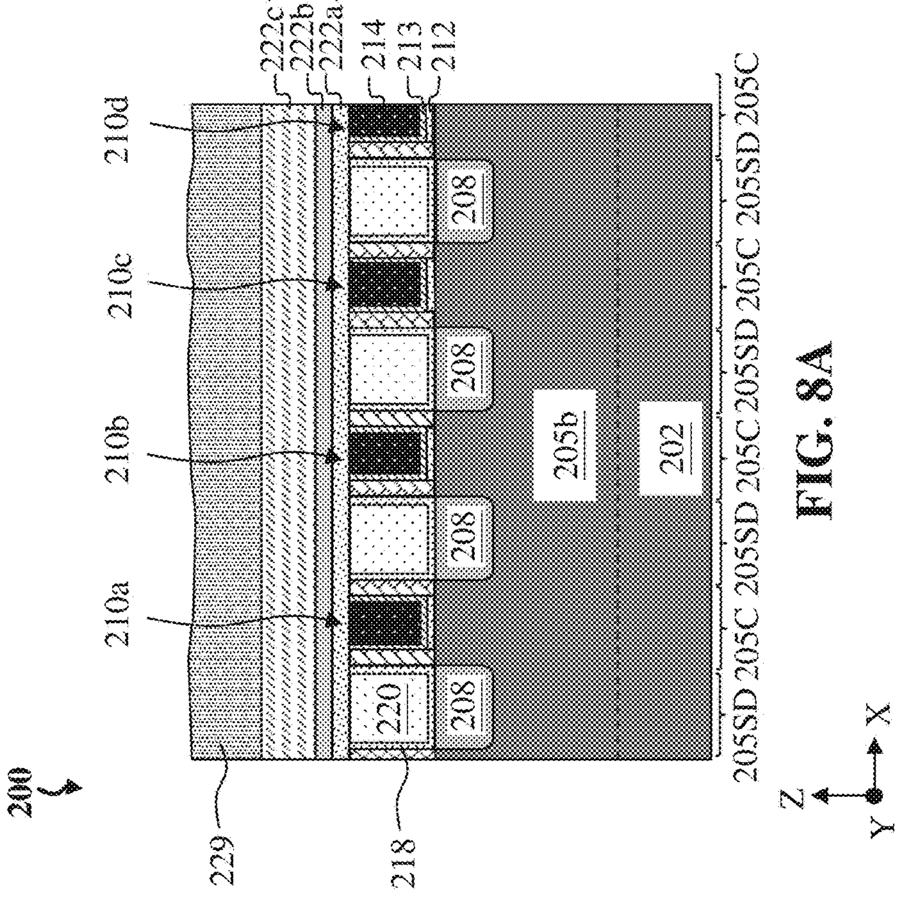
Figure 8B:
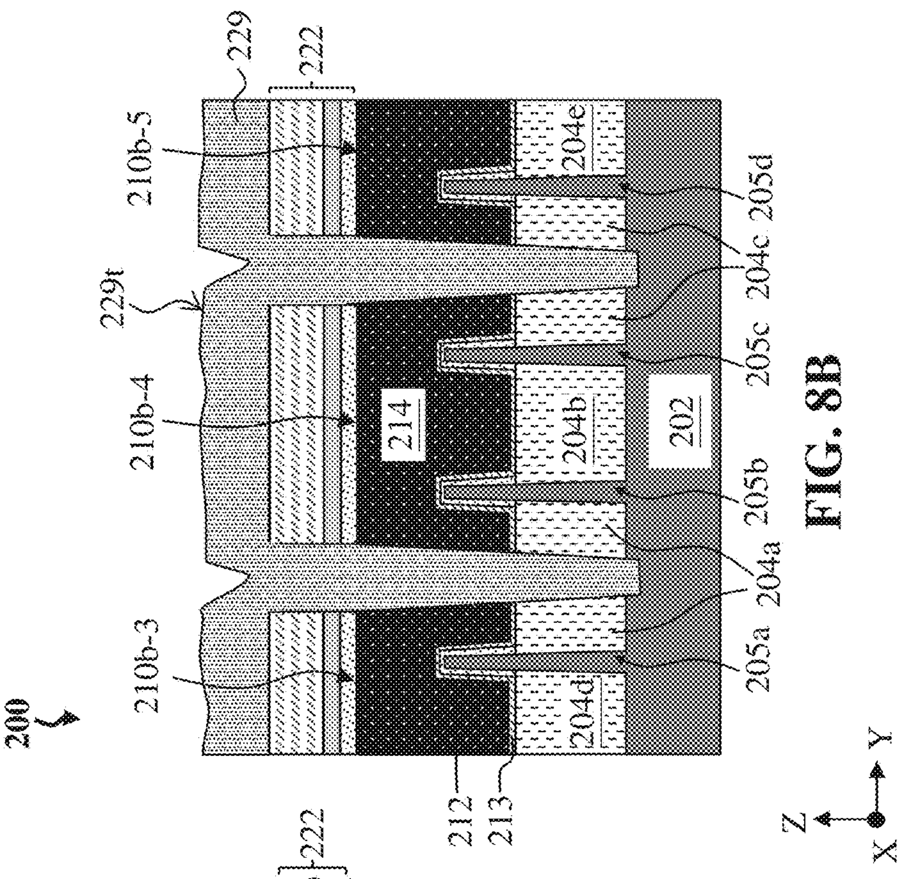

Referring to FIGS. 1, 7A, and 7B, method 100 includes a block 108 where an etching process is performed to form a first gate isolation trench 228a and a second gate isolation trench 228b to cut the gate structure 210b into pieces. After forming the patterned mask structure 222 that includes the first opening 226a and the second opening 226b, while using the patterned mask structure 222 as an etch mask, an etching process is performed to the workpiece 200 to form the first gate isolation trench 228a and the second gate isolation trench 228b. In embodiments represented in FIG. 7B, this etching process removes the first portion 210b-1 of the gate structure 210b, a portion of the STI feature 204a disposed directly under the first portion 210b-1 of the gate structure 210b, the second portion 210b-2 of the gate structure 210b, and a portion of the STI feature 204c disposed directly under the second portion 210b-2 of the gate structure 210b. In the present embodiments, the first gate isolation trench 228a and the second gate isolation trench 228b both extend through the gate structure 210b and the STI features and extend downward into the substrate 202. The first gate isolation trench 228a and the second gate isolation trench 228b separate a remaining portion of the gate structure 210b into three segments: a third portion 210b-3, a fourth portion 210b-4, and a fifth portion 210b-5. In embodiments represented in FIG. 7B, the first gate isolation trench 228a is disposed between the fin-shaped structure 205a and the fin-shaped structure 205b, and the second gate isolation trench 228b is disposed between the fin-shaped structure 205c and the fin-shaped structure 205d. The third portion 210b-3 of the gate structure 210b wraps over the fin-shaped structure 205a, the fourth portion 210b-4 of the gate structure 210b wraps over the fin-shaped structures 205b and 205c, and the fifth portion 210b-5 of the gate structure 210b wraps over the fin-shaped structure 205d. It is understood that the workpiece 200 may include any suitable number of fin-shaped structures, and the fourth portion 210b-4 of the gate structure 210b may wrap over any suitable number (e.g., 1, 2, 3, 4, or more) of the fin-shaped structures. Although not shown, in a top view of the workpiece 200, each of the first gate isolation trench 228a and the second gate isolation trench 228b extends lengthwise along the X direction and further separates the gate structures 210a, 210c, and 210d.

Referring to FIGS. 1, 8A, 8B, 9A, 9B, and 10, method 100 includes a block 110 where a first gate isolation structure 230a is formed in the first gate isolation trench 228a and a second gate isolation structure 230b is formed in the second gate isolation trench 228b. The formation of the first gate isolation structure 230a and the second gate isolation structure 230b may include depositing a dielectric layer 229 (shown in FIGS. 8A-8B) over the workpiece 200 to substantially fill the first gate isolation trench 228a and the second gate isolation trench 228b. The dielectric layer 229 may include silicon oxide, silicon nitride, silicon carbide, silicon oxynitride, silicon oxycarbide, silicon carbonitride, a low-k dielectric material, other suitable materials, or combinations thereof, and may be deposited by CVD, PECVD, flowable CVD, PVD, ALD, other suitable methods, or combinations thereof. In an embodiment, the dielectric layer 229 includes furnace silicon nitride. A top surface 229t of the dielectric layer 229 may not be planar due to the exist of the first gate isolation trench 228a and the second gate isolation structure 230b. For example, a portion of the top surface 229t directly over the first/second gate isolation structure 230*a*/230*b* may be a concave surface and below a remaining portion of the top surface 229*t*.

Figure 9A:
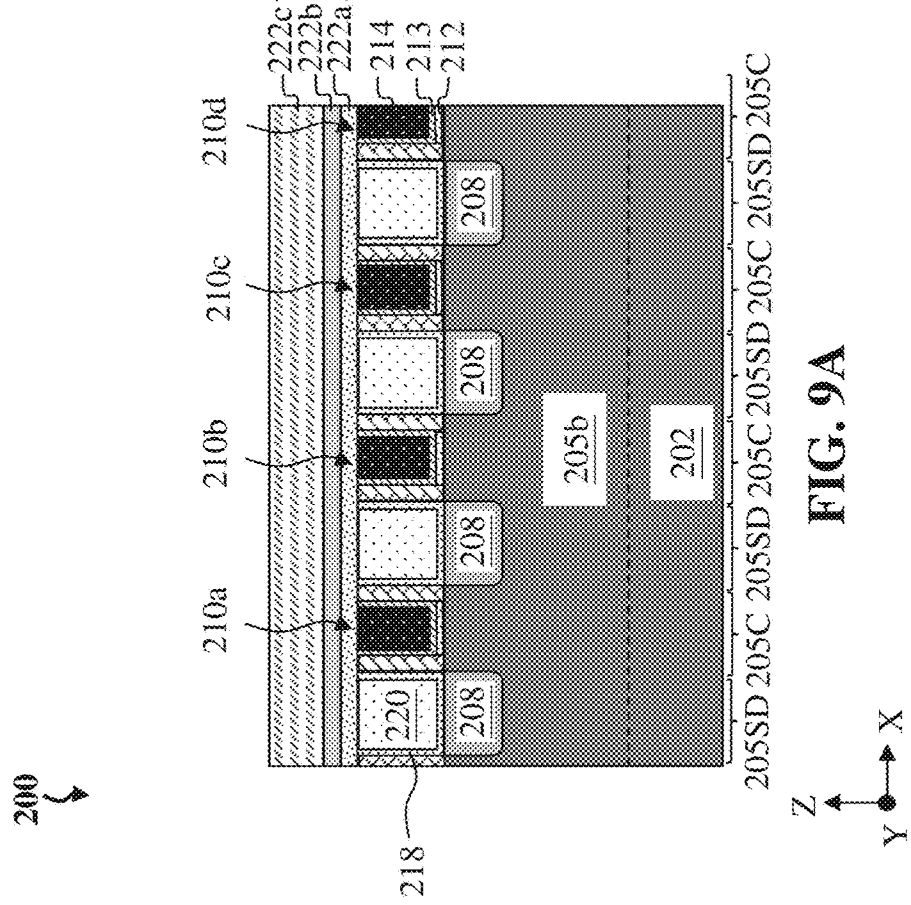
Figure 9B:
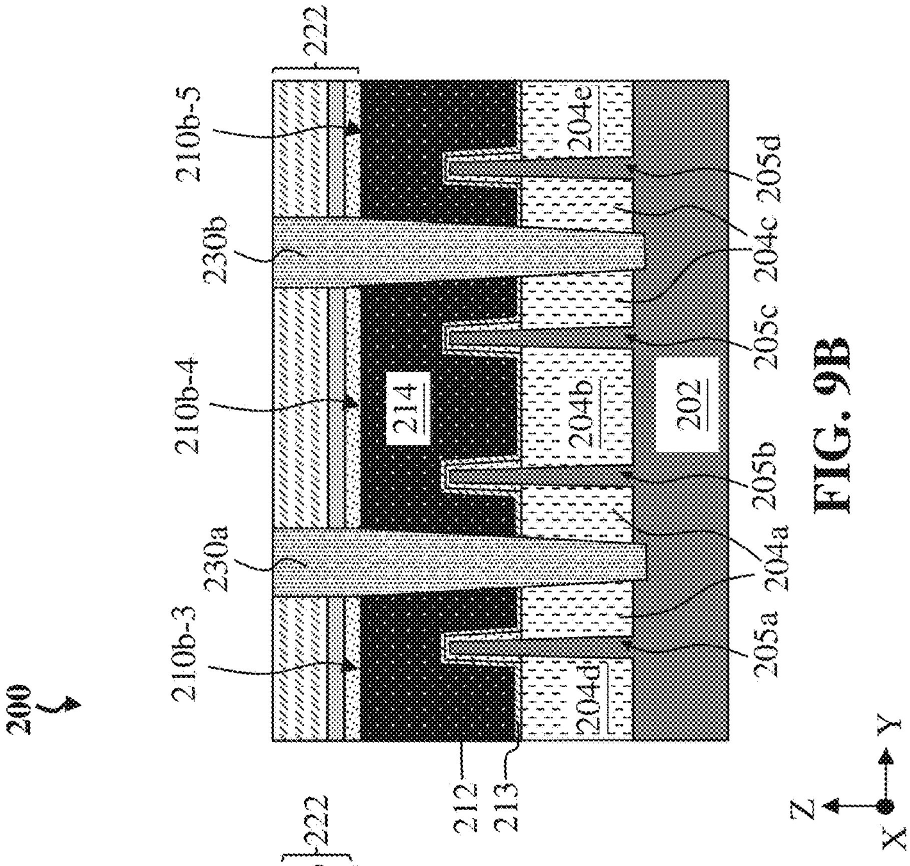
Figure 10:
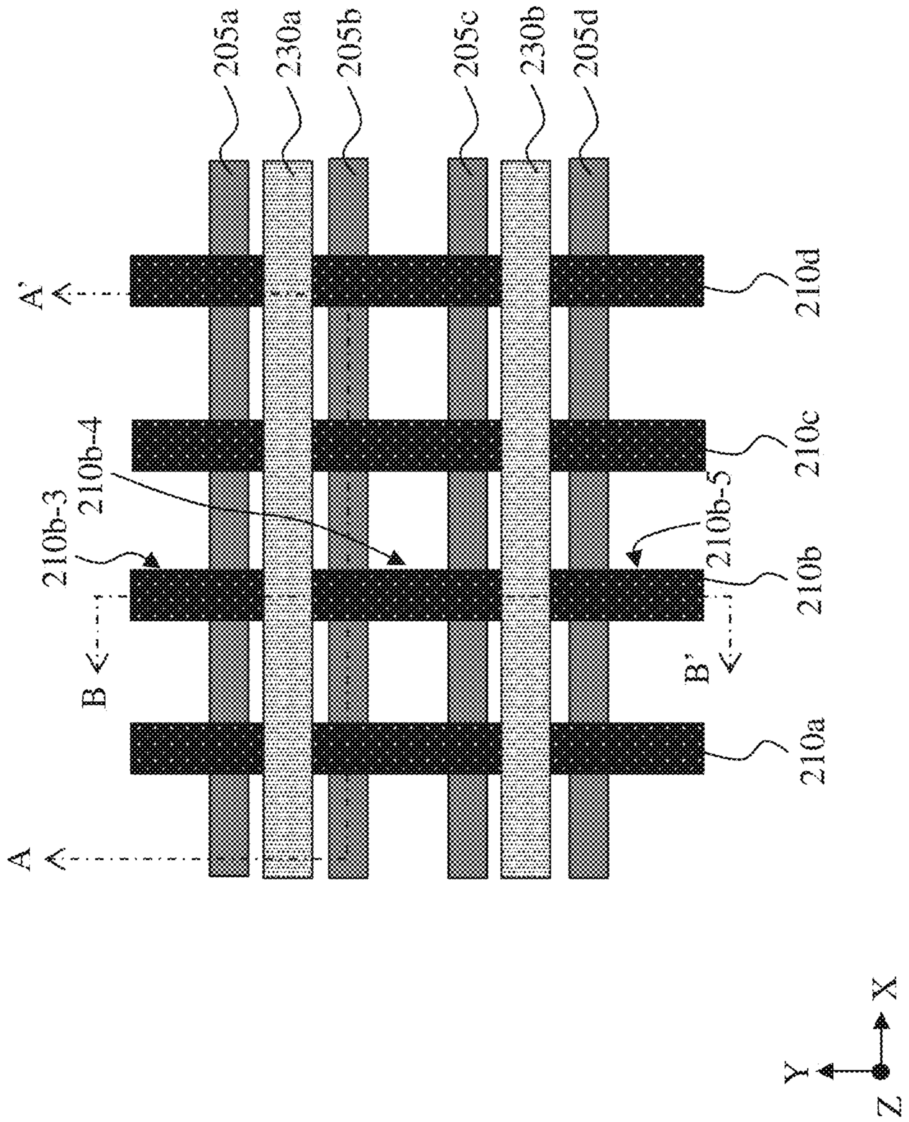
FIG. 10 illustrates a fragmentary top view of an exemplary semiconductor structure shown in FIGS. 9A-9B, according to various embodiments of the present disclosure.

In the present embodiments, as depicted in FIGS. 9A-9B, after the deposition of the dielectric layer 229, a planarization process (e.g., one or more CMP processes) is performed to remove excess portions of the dielectric layer 229 to expose a top surface of the mask structure 222, thereby forming the first gate isolation structure 230*a* and the second gate isolation structure 230*b*. As depicted herein, the third portion 210*b*-3 and fourth portion 210*b*-4 of the gate structure 210*b* are electrically and physically isolated by the first gate isolation structure 230*a*, and the fourth portion 210*b*-4 and fifth portion 210*b*-5 of the gate structure 210*b* are electrically and physically isolated by the second gate isolation structure 230*b*. In the present embodiments, bottom surfaces of the first gate isolation structure 230*a* and the second gate isolation structure 230*b* are below bottom surfaces of the STI features 204*a*-204*e*. FIG. 10 depicts a fragmentary top view of the workpiece 200 shown in FIGS. 9A-9B. The first gate isolation structure 230*a* and the second gate isolation structure 230*b* each extends lengthwise along the X direction (which is substantially perpendicular to the direction of gate structure 210*b*) and collectively cut the gate structure 210*b* into three portions 210*b*-3, 210*b*-4, and 210*b*-5. In the present embodiments, the first gate isolation structure 230*a* and the second gate isolation structure 230*b* further cut each of the gate structures 210*a*, 210*c* and 210*d* into three portions.

Figure 11B:
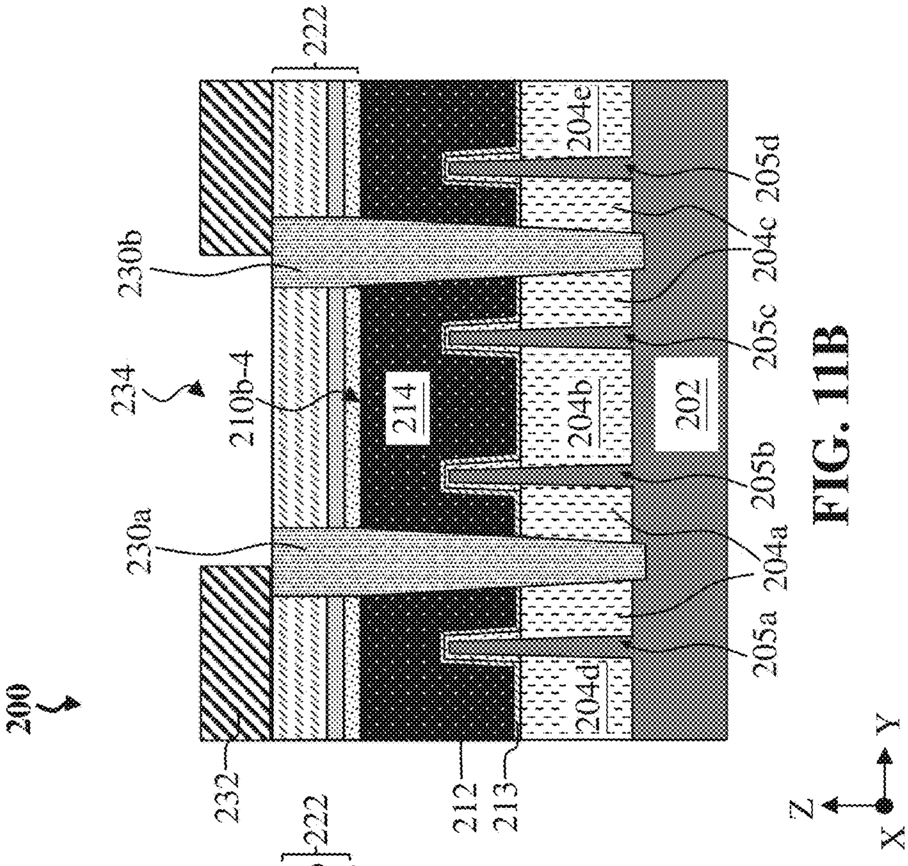
Figure 11A:
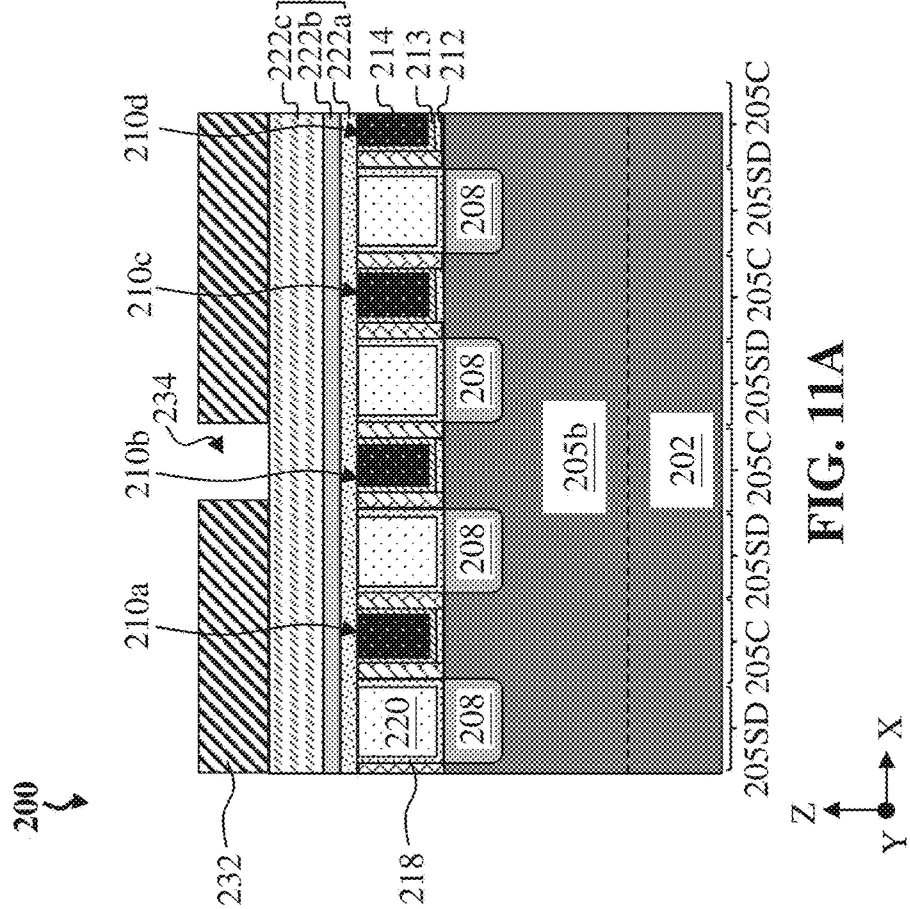

Referring to FIGS. 1, 11A, and 11B, method 100 includes a block 112 where a patterned mask film 232 is formed over the workpiece 200. The patterned mask film 232 may include one or more material layers, such as a bottom layer, a middle layer formed on the bottom layer, and a top photoresist layer formed on the middle layer. In some embodiments, the bottom layer may include a hard mask material such as a carbon-containing material. The middle layer may include anti-reflective materials (e.g., a backside anti-reflective coating (BARC) layer) to aid the exposure and focus of the top photoresist layer. The patterned mask film 232 includes an opening 234 configured to facilitate the removal of a portion of the gate structure 210*b*. In the present embodiments, the opening 234 exposes a portion of the mask structure 222 disposed directly over the fourth portion 210*b*-4 of the gate structure 210*b*, as exemplary shown in FIGS. 11A and 11B. As depicted in FIG. 11B, the opening 234 further partially exposes the first gate isolation structure 230*a* and the second gate isolation structure 230*b*.

Figure 12A:
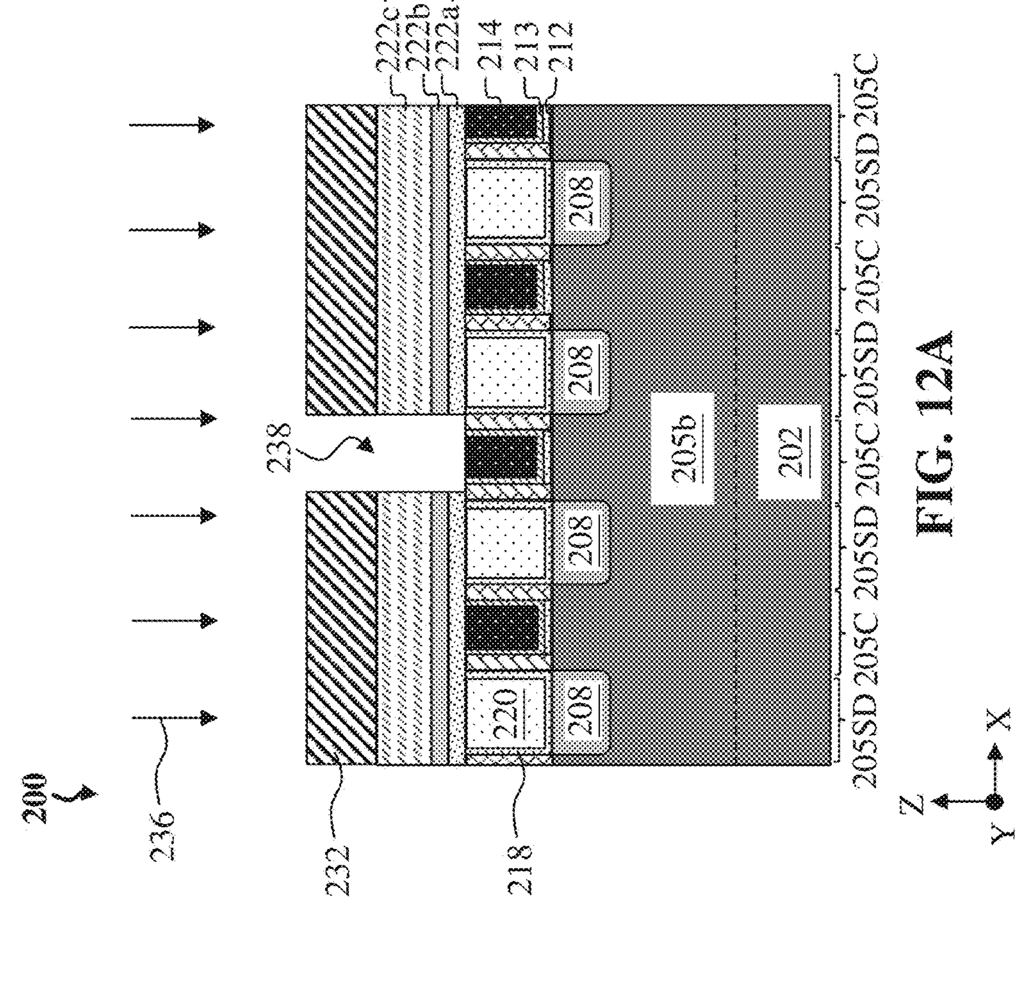
Figure 12B:
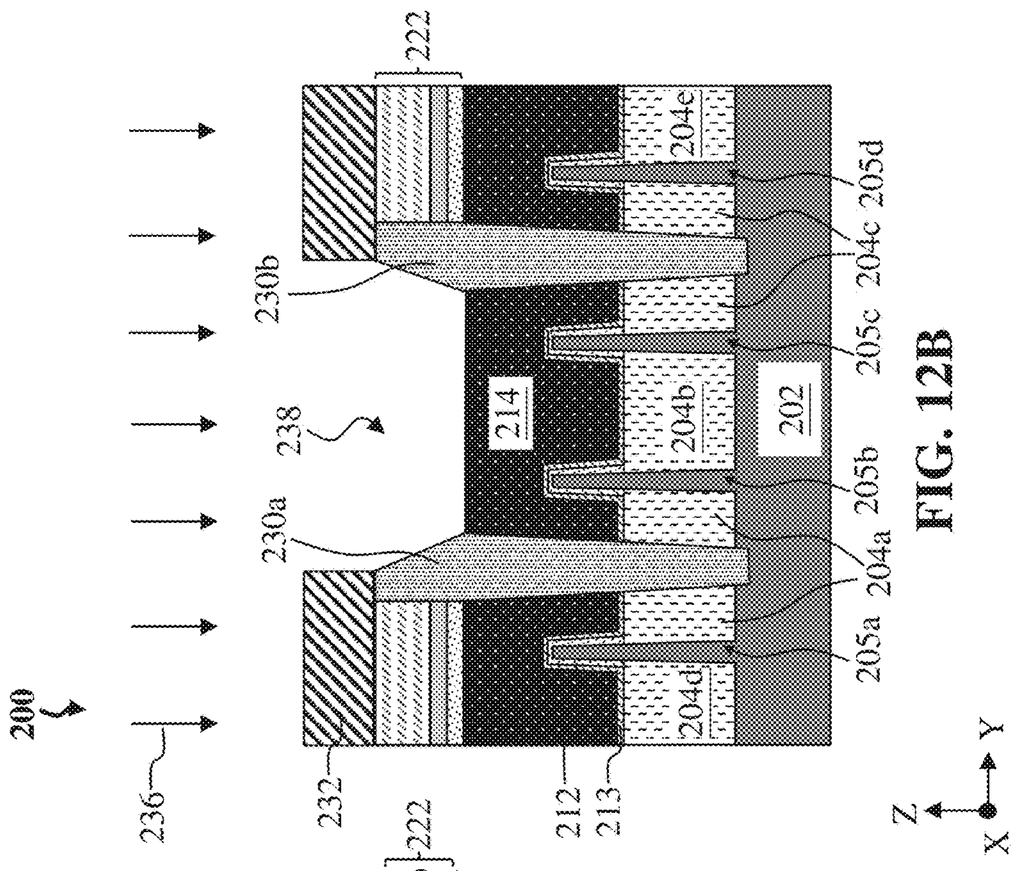

Referring to FIGS. 1, 12A, and 12B, method 100 includes a block 114 where the portion of the mask structure 222 not covered by the patterned mask film 232 is removed. While using the patterned mask film 232 as an etch mask, an etching process 236 is performed to remove the portion of the mask structure 222 not covered by the patterned mask film 232. The performing of the etching process 236 forms an opening 238 exposing the top surface of the gate electrode 214 of the fourth portion 210*b*-4 of the gate structure 210*b*. The etching process 236 may include a dry etching process, a wet etching process, or another other suitable etching process. In the present embodiment, a composition of the first and second gate isolation structures 230*a* and 230*b* is the same as a composition of the third layer 222*c* of the mask structure 222, and the etching process 236 further removes portions of the first and second gate isolation structures 230*a* and 230*b* exposed by the opening 234 of the patterned mask film 232. As depicted in FIG. 12B, a shape of a cross-sectional view of the opening 238 includes an inverted trapezoid. In some other implementations, a cross-sectional view of the opening 238 may be shaped as a a rectangle. After exposing the top surface of the gate electrode 214 of the fourth portion 210*b*-4 of the gate structure 210*b*, the patterned mask film 232 may be then selectively removed.

Figure 13B:
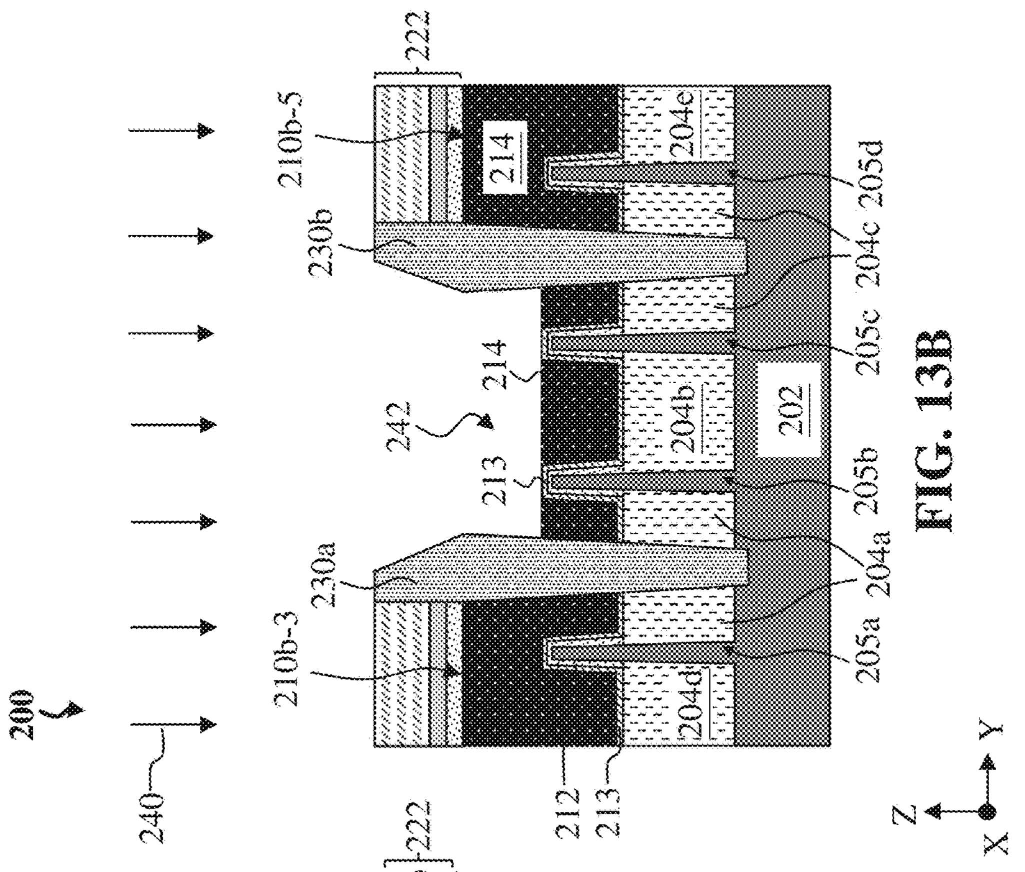
Figure 13A:
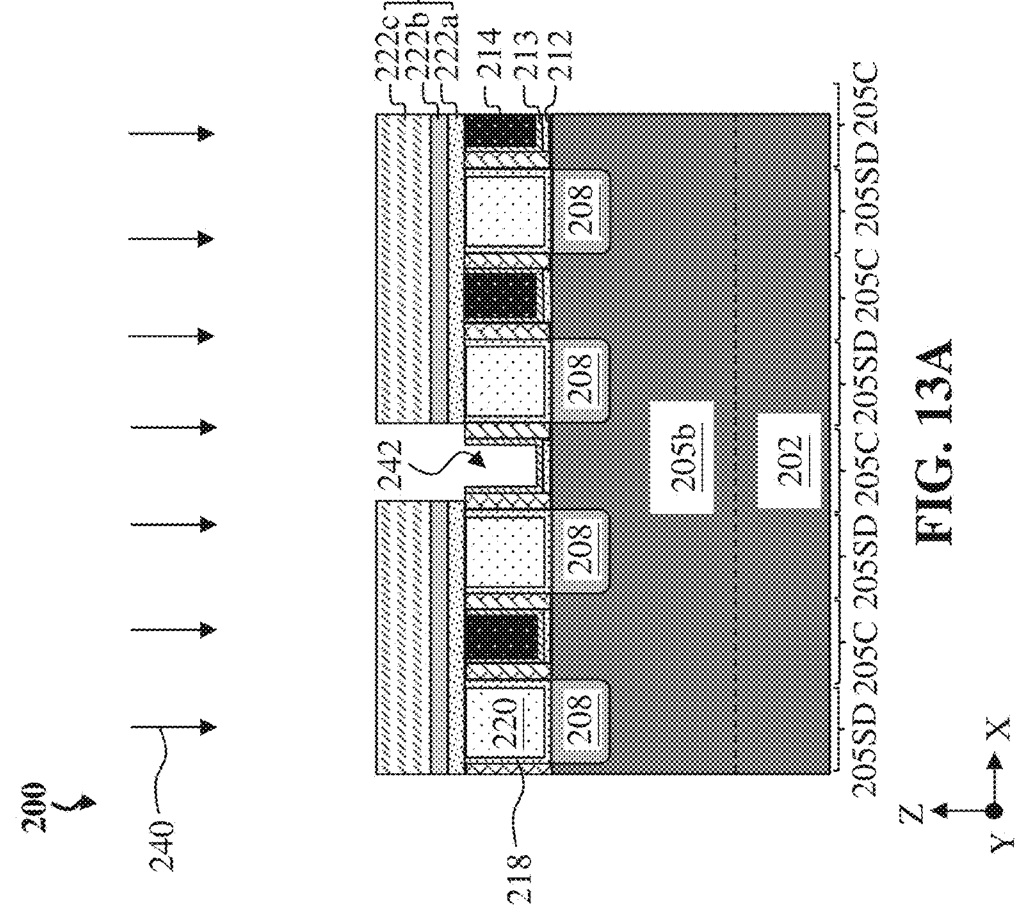

Referring to FIGS. 1, 13A, and 13B, method 100 includes a block 116 where an etching process 240 is performed to selectively recess the gate structure 210*b*. More specifically, the etching process 240 is performed to selectively recess the gate electrode 214 of the fourth portion 210*b*-4 of the gate structure 210*b* to form a trench 242. The etching process 240 selectively recesses the gate electrode 214 without substantially etching the mask structure 222, the first and second gate isolation structures 230*a* and 230*b*, the gate spacers 216, and the high-k dielectric layer 213. As depicted in FIGS. 13A-13B, after the performing of the etching process 240, portions of the high-k dielectric layer 213 that is formed on top surfaces of the fin-shaped structures 205*b* and 205*c* are exposed in the trench 242. The workpiece 200 still includes a remaining part of the fourth portion 210*b*-4 of the gate structure 210*b* formed directly on the STI features 204*a*, 204*b*, and 204*c*. In an embodiment, the etching process 240 is a wet etching process.

Figures 14A, 14B:
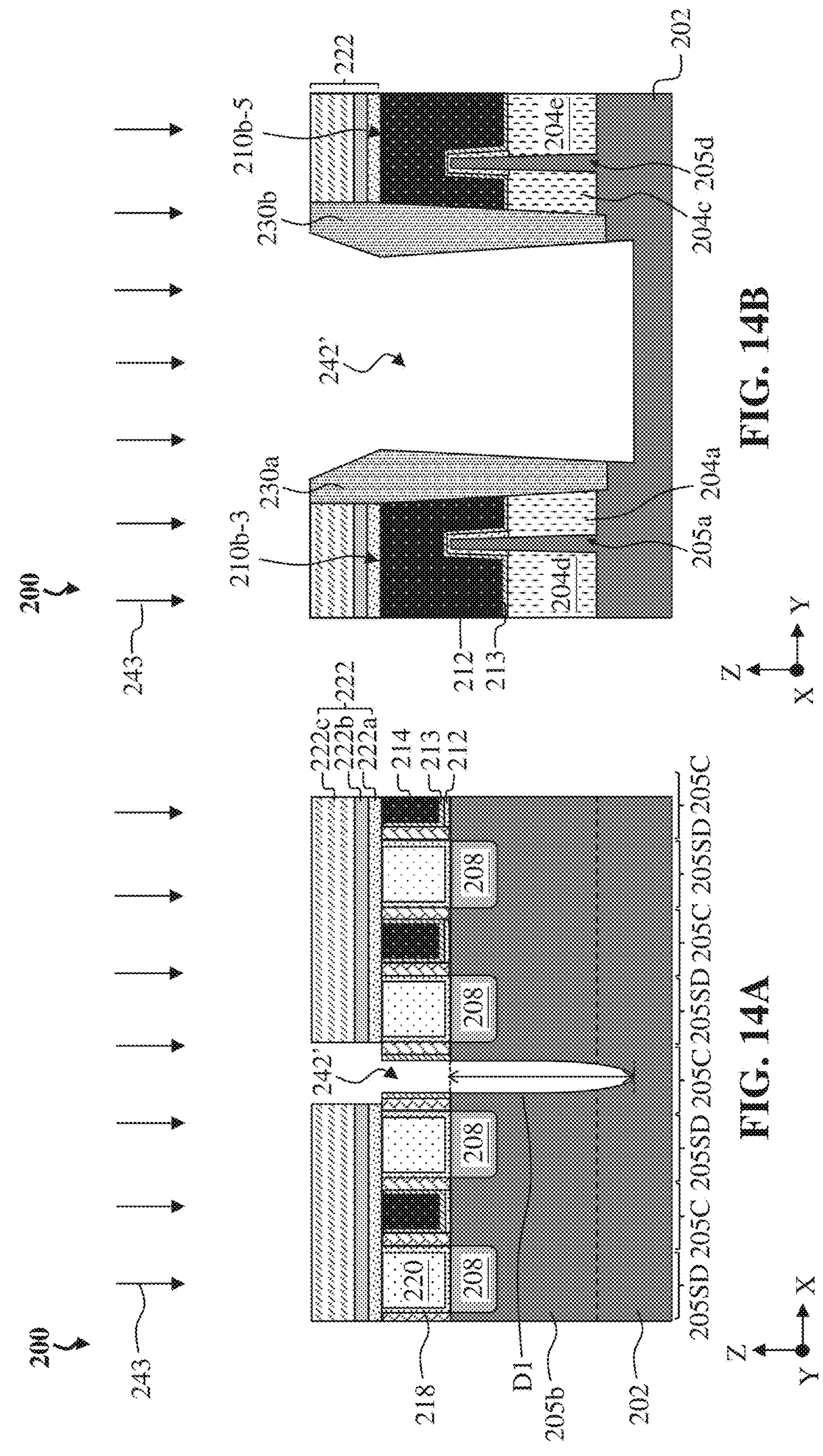
Figure 15B:
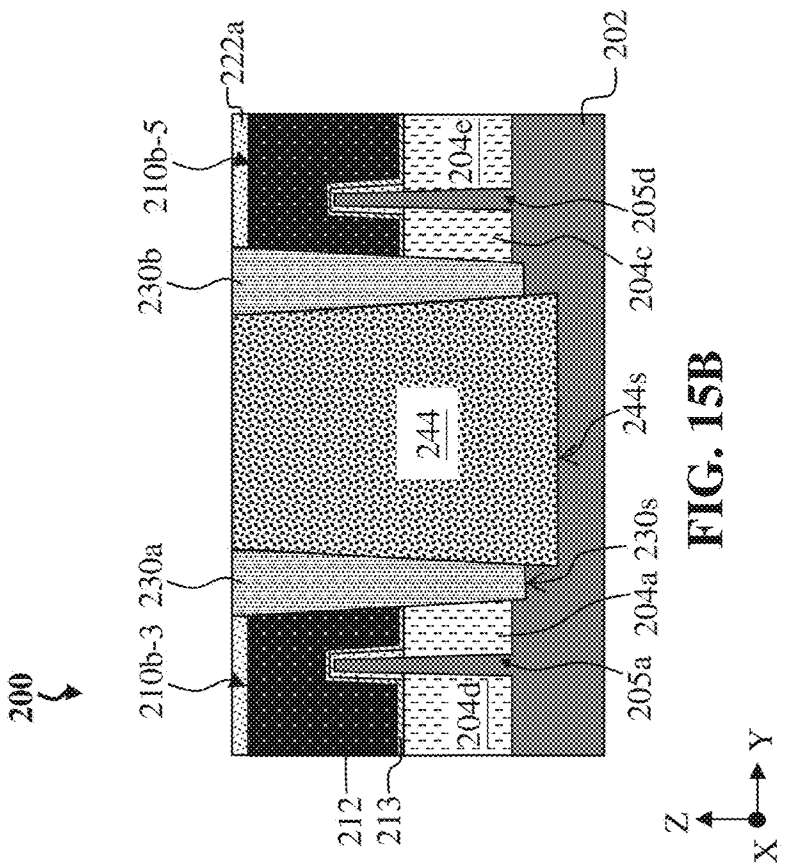
Figure 15A:
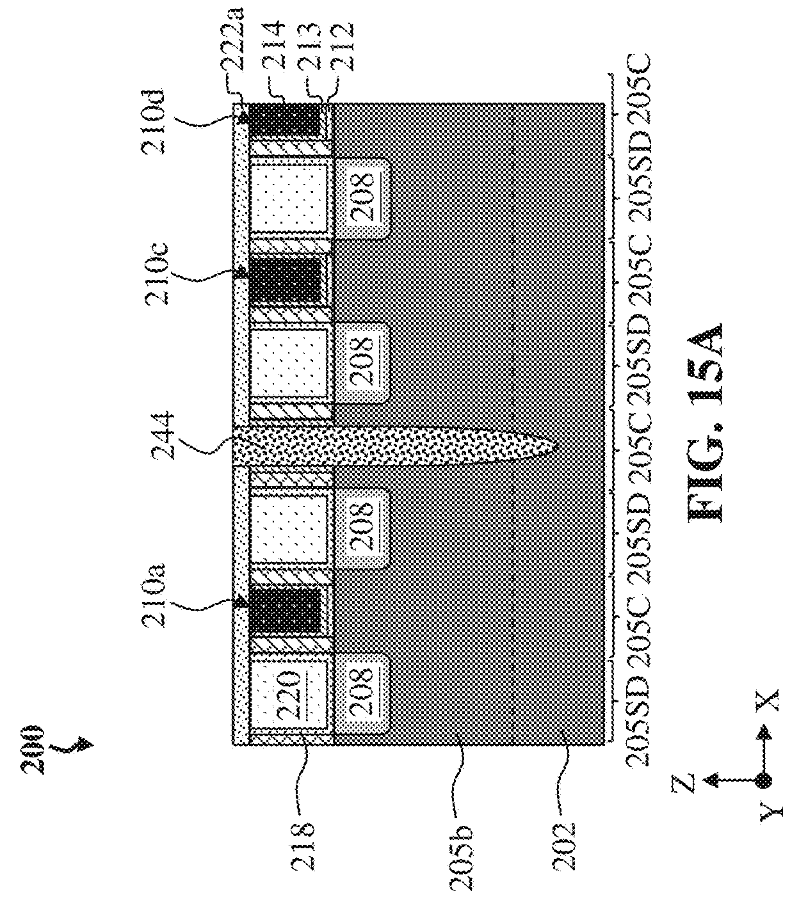

Referring to FIGS. 1, 14A, and 14B, method 100 includes a block 118 where a remaining part of the fourth portion 210*b*-4 of the gate structure 210*b*, and fin-shaped structures 205*b*-205*c* and STI features disposed directly under the fourth portion 210*b*-4 of the gate structure 210*b* are selectively removed to extend the trench 242. In the present embodiments, after forming the trench 242, an etching process 243 is performed to vertically extend the trench 242 downward into the substrate 202 without substantially etching the first and second gate isolation structures 230*a* and 230*b*. The extended trench 242 may be referred to as a CPODE trench 242'. The extended portion of the CPODE trench 242' has a depth D1 that may be between about 100 nm and about 200 nm.

With respect to FIG. 14B, the etching process 243 selectively removes the features disposed between the first gate isolation structure 230*a* and the second gate isolation structure 230*b*. More specifically, the etching process 243 selectively removes a remaining part (e.g., a rest of the gate electrode 214, the high-k dielectric layer 213, the interfacial layer 212) of the fourth portion 210*b*-4 of the gate structure 210*b*, portions of the fin-shaped structures 205*b*-205*c* disposed directly under the fourth portion 210*b*-4 of the gate structure 210*b*, a portion of the STI feature 204*a* disposed between the first gate isolation structure 230*a* and the fin-shaped structure 205*b*, the STI feature 204*b*, and a portion of the STI feature 204*c* disposed between the second gate isolation structure 230*b* and the fin-shaped structure 205*c*. That is, the etching process 243 not only removes the portions of the fin-shaped structures 205*b*-205*c* disposed directly under the fourth portion 210*b*-4 of the gate structure 210*b*, but also removes the STI features surrounding the fin-shaped structures 205*b*-205*c*. Comparing to embodiments where an etching process removes the fin-shaped structures 205*b*-205*c* without removing the surrounding STI features to form a CPODE trench that has separate branches with high aspect ratios (aspect ratio refers to a ratio of height to width), removing the STI features along with the fin-shaped structures 205*b*-205*c* would form a single trench (i.e., the CPODE trench 242') with a reduced aspect ratio. In the present embodiments, the etching process 243 further recesses the portion of the substrate 202 disposed directly under the fourth portion 210*b*-4 of the gate structure 210*b*. As depicted in FIG. 14B, after the etching process 243, a bottom surface of the CPODE trench 242' only exposes the substrate 202 and is lower than bottom surfaces of the first and second gate isolation structures 230*a*-230*b*.

Referring to FIGS. 1, 15A-15B, 16A-16B, 17, and 18, method 100 includes a block 120 where a CPODE structure 244 is formed in the CPODE trench 242'. In some embodiments, the CPODE structure 244 is a single-layer structure. The formation of the CPODE structure 244 may include depositing a dielectric material layer (not shown) over the workpiece 200 to substantially fill the CPODE trench 242'. For example, the dielectric material layer may include silicon nitride, silicon oxycarbonitride, silicon carbonitride, silicon oxynitride, hafnium oxide, zirconium oxide, aluminum oxide, silicon oxide, doped silicon oxide, combinations thereof, or other suitable materials, and may be formed by any suitable method, including CVD, ALD, PVD, other methods, or combinations thereof. In an embodiment, the dielectric material layer includes silicon oxide. In an alternative embodiment, the CPODE structure 244 is a multi-layer structure. For example, the CPODE structure 244 may include a first dielectric layer extending along sidewall and bottom surfaces of a second dielectric layer. The first dielectric layer and the second dielectric layer have different compositions. In the present embodiments, after the deposition of the dielectric material layer, a first planarization process (e.g., CMP) is performed to remove excess materials to expose a top surface of the first layer 222*a* of the mask structure 222. That is, the first planarization process stops when a top surface of the first layer 222*a* is exposed. After the first planarization process, a top surface of the CPODE structure 244 and top surfaces of the first and second gate isolation structures 230*a*-230*b* are coplanar with a top surface of the first layer 222*a*. In embodiments represented in FIG. 15A, the CPODE structure 244 is spaced apart from the gate spacers 216 by the high-k dielectric layer 213. In embodiments represented in FIG. 15B, the CPODE structure 244 is in direct contact with both the first and second gate isolation structures 230*a*-230*b*. A bottom surface 244*s* of the CPODE structure 244 is below bottom surfaces 230*s* of the first and second gate isolation structures 230*a*-230*b*.

Figure 16B:
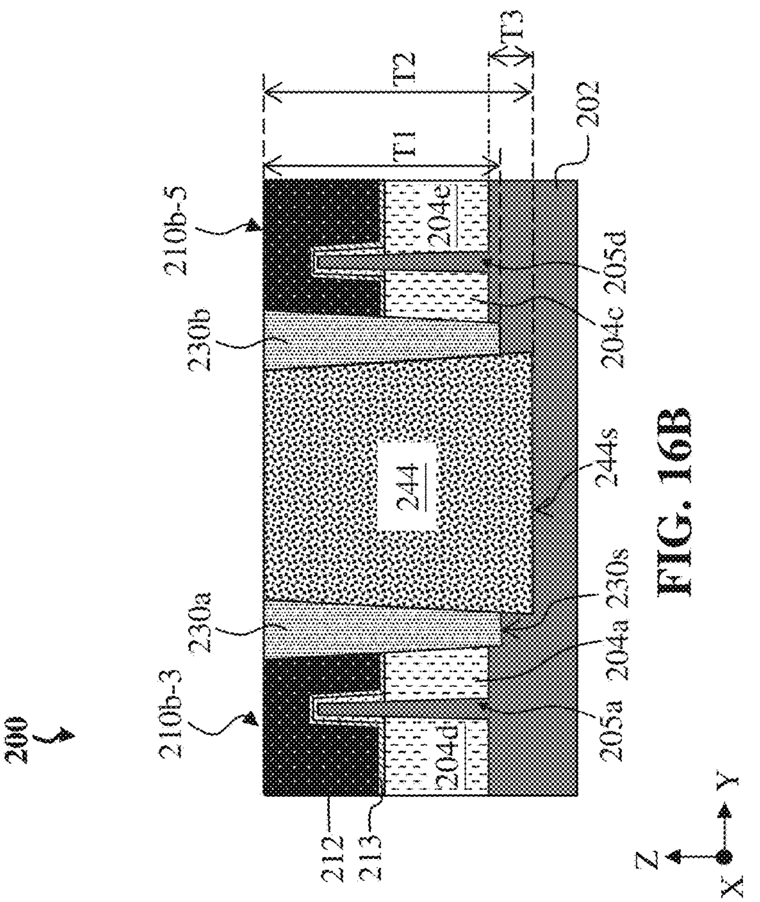
Figure 16A:
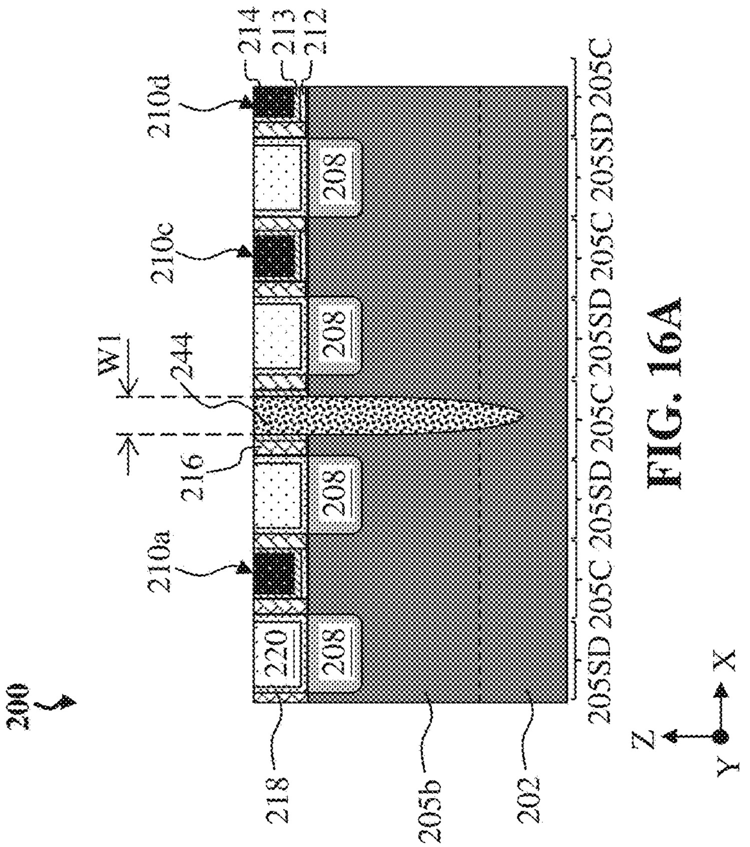
Figure 17:
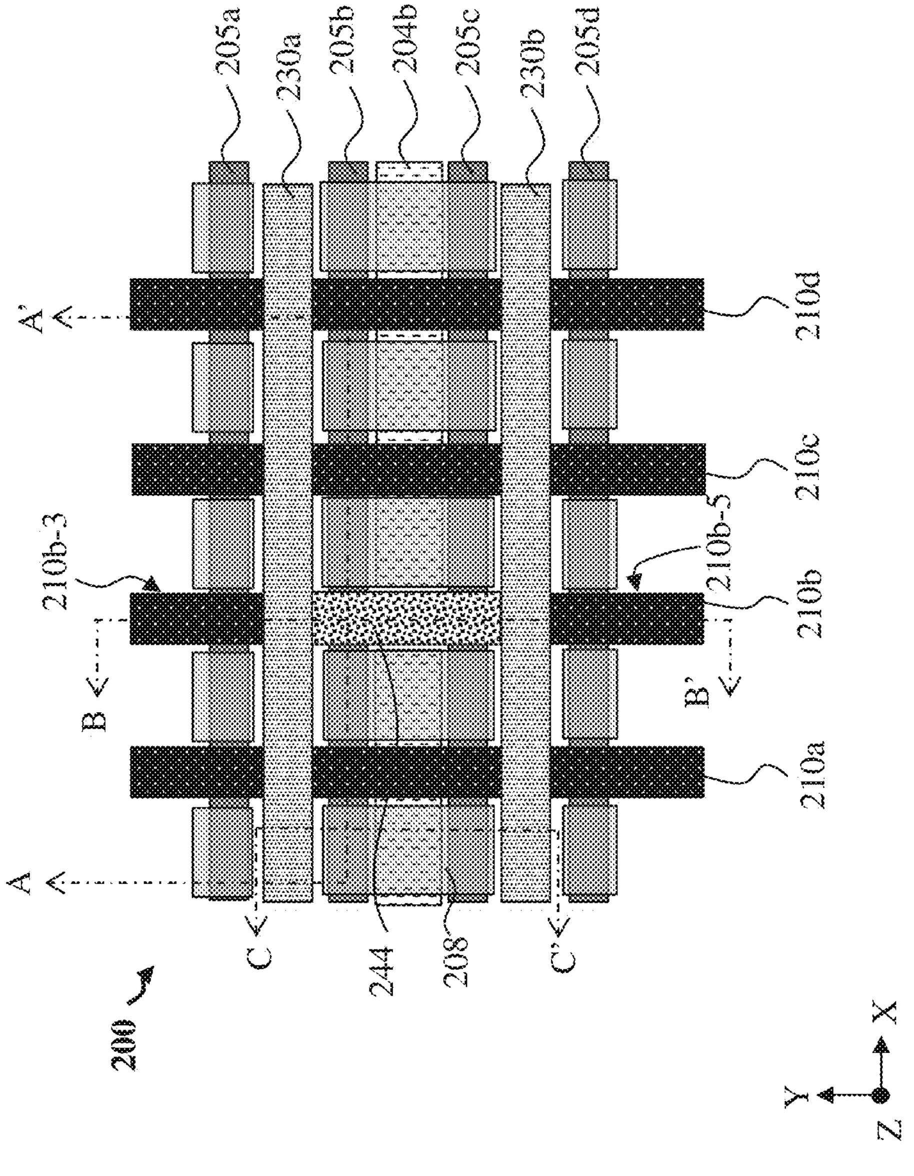
FIG. 17 illustrates a fragmentary top view of an exemplary semiconductor structure shown in FIGS. 16A-16B, according to various embodiments of the present disclosure.
Figure 18:
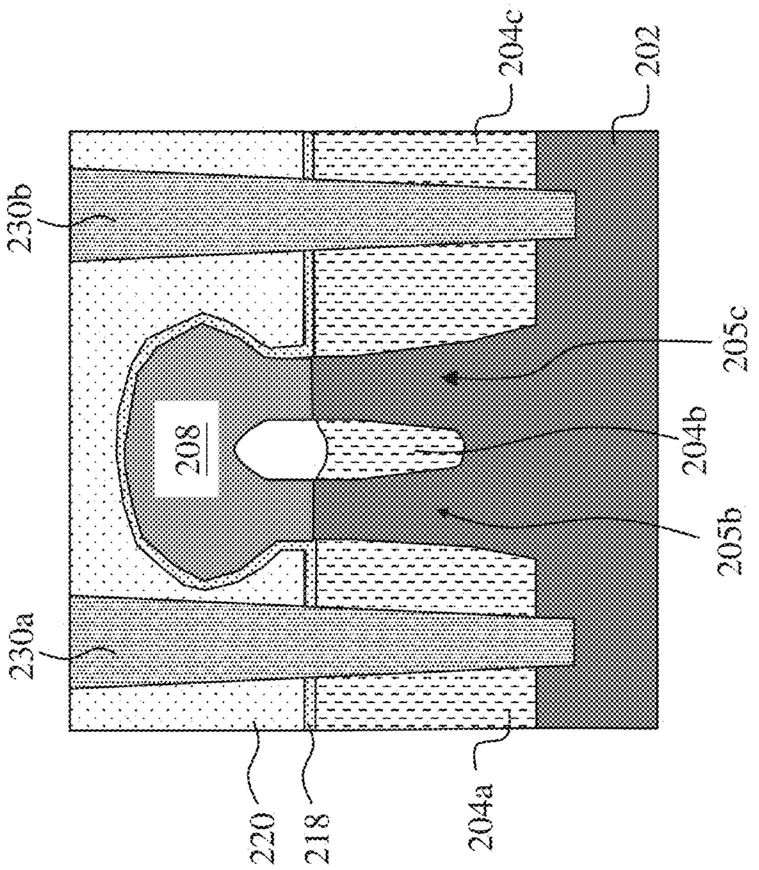
FIG. 18 illustrates a fragmentary cross-sectional view of the workpiece taken along line C-C' as shown in FIG. 17.

As depicted in FIGS. 16A-16B, after forming the CPODE structure 244, a second planarization process (e.g., CMP) is then performed to the workpiece 200 to define a final height for the CPODE structure 244 and a final height for the gate structures 210*a*-210*d*. The CPODE structure 244 has a width W1 along the X direction. In the present embodiments, the width W1 is less than a total width of the gate structure 210 and gate spacers 216 extending along sidewalls of the gate structure 210*a*. In an embodiment, the width W1 may be between about 15 nm and 30 nm. Along the Z direction, a thickness T2 of the CPODE structure 244 is greater than a thickness T1 of the first/second gate isolation structure 230*a*/230*b*. In the present embodiments, an entirety of the bottom surface 244*s* of the CPODE structure 244 is in direct contact with the substrate 202. In an embodiment, a distance T3 between the bottom surface 244*s* of the CPODE structure 244 and the bottommost surface of the STI structures 204*a*-204*e* may be greater than 5 nm. For example, T3 may be between about 25 nm and about 100 nm. FIG. 17 depicts a fragmentary top view of the workpiece 200 shown in FIGS. 16A-16B. FIG. 18 depicts a fragmentary cross-sectional view of the workpiece 200 taken along line C-C' as shown in FIG. 17. In embodiments represented in FIGS. 16A-16B and 17, the CPODE structure 244 extends lengthwise along the Y direction and cut the continuous fin-shaped structure 205*b* into two electrically and physically isolated pieces and also cut the continuous fin-shaped structure 205*c* into two electrically and physically isolated pieces. In some other implementations, the CPODE structure 244 may cut one fin-shaped structure, or two or more (e.g., three, four, five . . . ) fin-shaped structures. In embodiments represented in FIG. 17 and FIG. 18, each of the source/drain features 208 spans over two fin-shaped structures 205*b*-205*c*, and the CPODE structure 244 isolates two adjacent dual-fin devices. In some embodiments, each of the source/drain features 208 spans over any suitable number (e.g., 1, 3, 4, . . . ) of fin-shaped active structures. In some embodiments, along the Z direction, a thickness of the STI feature 204*b* formed between the fin-shaped structures 205*b*-205*c* may be less than a thickness of the STI feature 204*a*/204*c*.

Referring to FIG. 1, method 100 includes a block 122 where further processes are performed to finish the fabrication process. Such further processes may include forming a silicide layer (not depicted) over the source/drain features 208 and a multi-layer interconnect (MLI) structure (not depicted) over the workpiece 200. The MLI may include various interconnect features, such as vias and conductive lines, disposed in dielectric layers, such as etch-stop layers and ILD layers (such as ILD layer 220). In some embodiments, the vias are vertical interconnect features configured to interconnect device-level contacts, such as source/drain contacts formed over the source/drain features 208 and gate contacts (not depicted) formed over the gate structures 210*a*-210*d*.

Figure 19B:
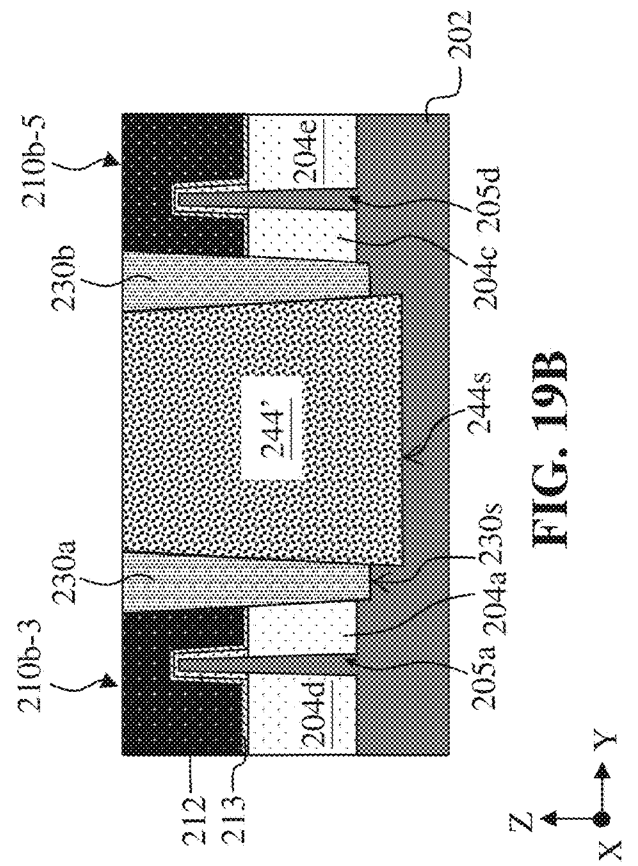
Figure 19A:
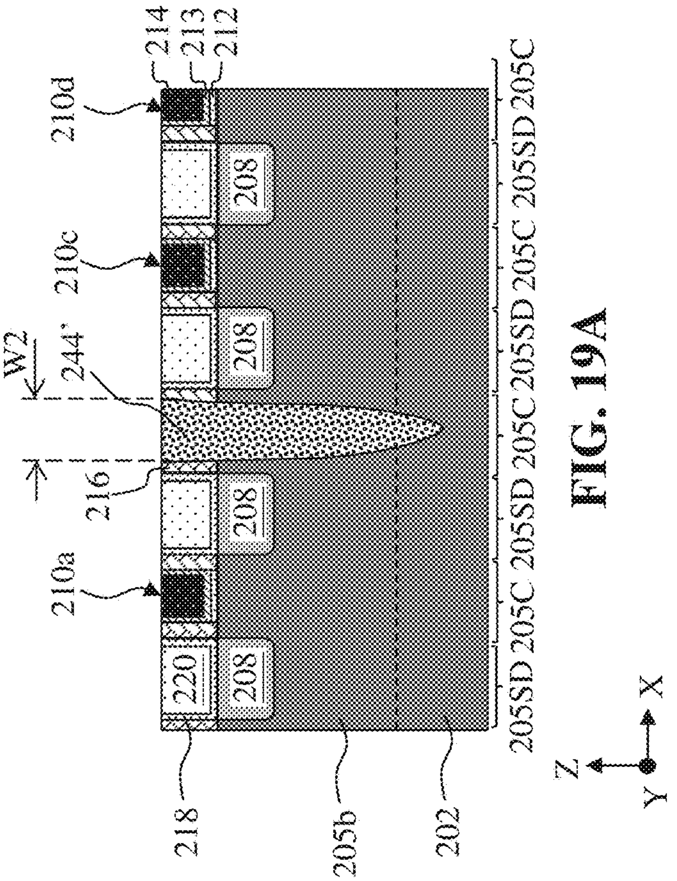

In the above embodiments described with reference to FIGS. 1-18, each of the gate structures 210*a*-210*d* includes the interfacial layer 212, the high-k dielectric layer 213 formed on the interfacial layer 212 and having a U-shape in a cross-sectional view, and a gate electrode 214 that includes work function layers. The CPODE structure 244 and the gate isolation structures 230*a*-230*b* are formed after the formation of the gate structures 210*a*-210*d*. In some alternative embodiments, a gate replacement process (or gate-last process) is adopted where some of dummy gate stacks (including a gate dielectric layer (e.g., $SiO_2$) and a dummy gate electrode (e.g., polysilicon) on the gate dielectric layer, not shown) serve as placeholders for those functional gate structures 210*a*-210*d*, and a CPODE structure 244' and/or the gate isolation structures 230*a*-230*b* are formed after the formation of the dummy gate stacks and before the formation of the gate structures 210*a*-210*d*. That is, at least a portion of one of the dummy gate stacks and features thereunder (e.g., channel regions of the fin-shaped structures and STIs surrounding the fin-shaped structures) would be replaced by a CPODE structure 244' (shown in FIGS. 19A-19B) to provide an isolation between neighboring active regions. The remaining portion of those dummy gate stacks may be then replaced with the functional gate structures 210*a*-210*d*. That is, the CPODE structure 244' is formed before the forming of the functional gate structures 210*a*-210*d*. Instead of having a U-shape profile, the gate dielectric layer in the dummy gate stack may only have a flat portion that would be substantially removed to form the CPODE trench. FIGS. 19A-19B depict cross-sectional views of a workpiece 200' that includes the CPODE structure 244'. The workpiece 200' is similar to the workpiece 200 represented in FIGS. 16A-16B, except that the CPODE structure 244' is in direct contact with the gate spacers 216 and has a width W2 greater than the width W1 due to the absence of the high-k dielectric layer during the formation of the CPODE structure 244'. In some embodiments, the gate spacers 216 may be slightly etched during the formation of the CPODE structure 244'.

Figure 20:
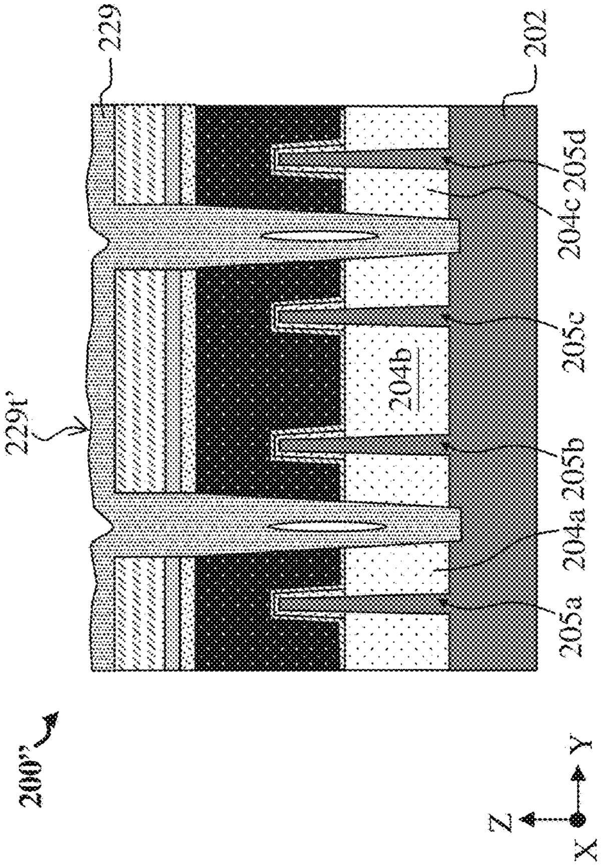
FIGS. 20 and 21 illustrate fragmentary cross-sectional views of an alternative workpiece taken along line B-B' as shown in FIG. 2 during various fabrication stages in the method of FIG. 1, according to various aspects of the present disclosure.
Figure 21:
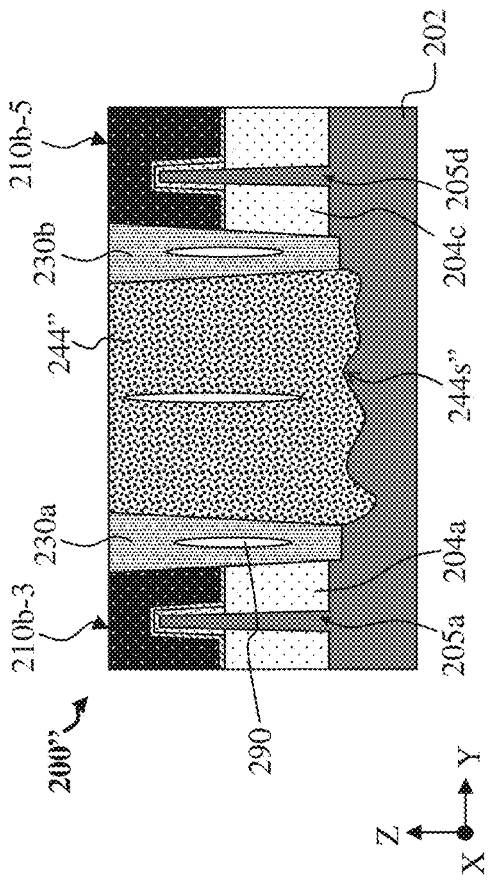

In the above embodiments described with reference to FIGS. 8A-8B and FIGS. 9A-9B, after the deposition of the dielectric layer 229 over the workpiece 200, a planarization process (e.g., one or more CMP processes) is performed to remove excess portions of the dielectric layer 229 to expose a top surface of the mask structure 222. In some other implementations represented in FIGS. 20-21, after the deposition of the dielectric layer 229 over the workpiece 200, an etching process may be performed to etch back the dielectric layer 229 to reduce a thickness of the dielectric layer 229 formed on the top surface of the mask structure 222. After the etching process, the dielectric layer 229 still has a nonplanar or uneven top surface 229*t*', as represented in FIG. 20. Operations in blocks 112-122 of method 100 may be then performed to finish the fabrication of the workpiece. Different from the CPODE structure 244 shown in FIGS. 16A-16B, a CPODE structure 244" of workpiece 200" represented in FIG. 21 has a bottom surface 244*s*". Due to the nonplanar top surface 229*t*' of the dielectric layer 229 and thus different etch depths, a bottom surface 244*s*" of the CPODE 244" is also nonplanar. In some embodiments, air gaps 290 may be formed in the gate isolation structures and/or the CPODE structure.

Although not intended to be limiting, one or more embodiments of the present disclosure provide many benefits to a semiconductor structure and the formation thereof. For example, the present disclosure provides an isolation structure, and methods of forming the same, disposed between two device regions. In the present embodiments, besides offering scaling capability to accommodate fabrication of devices at advanced technology nodes, the CPODE structure with a reduced aspect ratio allows improvement of etch process window, reduction of damage to gate structures and source/drain features, thereby improving the overall performance of the devices. In addition, removing the multiple fin-shaped structures without removing their surrounding STI features would lead to generate sharp corners for the STI features which would lead to discharge at sharp corners of those STI features. However, the present disclosure provides a CPODE structure that is formed by removing both the fin-shaped structures and their surrounding STIs, thereby providing a semiconductor structure having an increased breakdown voltage. In some embodiments, the present disclosure may be applied to form a first CPODE structure for isolating adjacent N-type transistors and a second CPODE structure in device regions for isolating adjacent P-type transistors. The first CPODE structure and the second CPODE structure may have substantially the same depth even if N-type transistors and P-type transistors may have active regions with different compositions (e.g., Si, SiGe). In some embodiments, methods of the present disclosure may be readily incorporated into the formation of CPODE structures in GAA transistors and other suitable structures.

The present disclosure provides for many different embodiments. Semiconductor structures and methods of fabrication thereof are disclosed herein. In one exemplary aspect, the present disclosure is directed to a method. The method includes receiving a workpiece comprising a first semiconductor fin and a second semiconductor fin separated by a first isolation feature over a substrate, and a gate structure comprising a first portion intersecting the first semiconductor fin and the second semiconductor fin and disposed directly over the first isolation feature. The method also includes removing the first portion of the gate structure, portions of the first semiconductor fin, the second semiconductor fin, and the first isolation feature disposed directly under the first portion of the gate structure to form a fin isolation trench, forming a dielectric layer over the workpiece to substantially fill the fin isolation trench, and planarizing the dielectric layer to form a fin isolation structure in the fin isolation trench, where a bottom surface of the fin isolation structure is lower than a bottommost portion of the gate structure and is lower than a bottommost portion of the first isolation feature.

In some embodiments, the workpiece may also include a first source/drain feature spanning over both the first semiconductor fin and the second semiconductor fin, and a second source/drain feature spanning over both the first semiconductor fin and the second semiconductor fin, where the fin isolation structure may be disposed between the first source/drain feature and the second source/drain feature. In some embodiments, the first semiconductor fin and the second semiconductor fin each may extend lengthwise along a first direction, the gate structure may extend lengthwise along a second direction that is substantially perpendicular to the first direction, and the fin isolation structure may extend lengthwise along the second direction. In some embodiments, the method may also include forming a first gate isolation structure extending through the gate structure and disposed adjacent to the first semiconductor fin, and forming a second gate isolation structure extending through the gate structure and disposed adjacent to the second semiconductor fin, where the fin isolation structure may be disposed between the first gate isolation structure and the second gate isolation structure along the second direction. In some embodiments, the fin isolation structure may be in direct contact with both the first gate isolation structure and the second gate isolation structure. In some embodiments, a thickness of the fin isolation structure may be greater than a thickness of the first gate isolation structure. In some embodiments, the forming of the first gate isolation structure and the second gate isolation structure may include forming a first trench extending through the gate structure and adjacent to the first semiconductor fin and a second trench extending through the gate structure and adjacent to the second semiconductor fin, depositing a dielectric material layer over the workpiece to substantially fill the first trench and the second trench, and etching back the dielectric material layer, thereby forming the first gate isolation structure in the first trench and the second gate isolation structure in the second trench. In some embodiments, the removing of the first portion of the gate structure and portions of the first semiconductor fin, the second semiconductor fin, and the first isolation feature disposed directly under the first portion of the gate structure may include performing a first etching process to selectively recess the first portion of the gate structure to form an opening, wherein a top surface of the recessed first portion of the gate structure is above top surfaces of the first semiconductor fin and the second semiconductor fin, and performing a second etching process to selectively remove a remaining part of the first portion of the gate structure, and the portions of the first semiconductor fin, the second semiconductor fin, and the first isolation feature thereunder to extend the opening, thereby forming the fin isolation trench. In some embodiments, the workpiece may also include a third semiconductor fin penetrating from the substrate, the gate structure may also include a second portion wraps over the third semiconductor fin, the method may also include, after the forming of the fin isolation structure in the fin isolation trench, replacing the second portion of the gate structure with a gate stack, where the gate stack may include a high-k dielectric layer and a work function layer disposed over the high-k dielectric layer.

In another exemplary aspect, the present disclosure is directed to a method. The method includes receiving a workpiece including a plurality of fins extending lengthwise along a first direction and over a substrate, a plurality of isolation features, wherein two adjacent fins of the plurality of fins are separated by a respective isolation feature of the plurality of isolation features, and a gate structure extending lengthwise along a second direction and directly over the plurality of fins and the plurality of isolation features, the second direction being substantially perpendicular to the first direction. The method also includes forming a first trench and a second trench to separate the gate structure into a first portion, a second portion, and a third portion, wherein the first portion is separated from the second portion and the third portion by the first trench and the second trench, respectively, forming a first isolation structure and a second isolation structure in the first trench and the second trench, respectively, after the forming of the first isolation structure and the second isolation structure, selectively removing the first portion of the gate structure, portions of the plurality of fins and portions of the plurality of isolation features disposed directly under the first portion of the gate structure to form a third trench, and forming a third isolation structure in the third trench.

In some embodiments, the first portion of the gate structure may be disposed directly over multiple fins of the plurality of fins. In some embodiments, a thickness of the third isolation structure may be greater than a thickness of the first isolation structure. In some embodiments, the forming of the first trench and the second trench may include depositing a first dielectric layer over the workpiece, depositing a material layer over the first dielectric layer, wherein a composition of the material layer is different from a composition of the first dielectric layer, depositing a hard mask layer over the material layer, patterning the hard mask layer, the material layer, and the first dielectric layer to form a first opening and a second opening, and performing a first etching process to selectively remove portions of the gate structure exposed by the first opening and the second opening to form the first trench and the second trench. In some embodiments, each of the first trench and the second trench may extend through portions of the plurality of isolation features and extend into the substrate. In some embodiments, the method may also include, after the forming of the first isolation structure and the second isolation structure, forming a patterned mask film over the workpiece, wherein the patterned mask film comprises a third opening, wherein the third openings is directly over the first portion of the gate structure and further exposes both the first isolation structure and the second isolation structure, and performing a second etching process to remove portions of the hard mask layer, the material layer, and the first dielectric layer disposed directly over the first portion of the gate structure to expose the first portion of the gate structure. In some embodiments, the gate structure is a first gate structure, the workpiece may also include a second gate structure extending lengthwise along the second direction and disposed adjacent to the first gate structure, where the first isolation structure and the second isolation structure further cut the second gate structure into three segments.

In yet another exemplary aspect, the present disclosure is directed to a semiconductor structure. The semiconductor structure includes a first transistor that includes a first fin and a second fin protruding from a substrate and spaced apart by an isolation feature, a first gate structure over channel regions of the first fin and the second fin, a first source/drain feature disposed and spanning over the first fin and the second fin. The semiconductor structure also includes a second transistor that includes a third fin and a fourth fin protruding from the substrate and spaced apart by the isolation feature, a second gate structure over channel regions of the third fin and the fourth fin, a second source/drain feature disposed and spanning over the third fin and the fourth fin. The semiconductor structure also includes a fin isolation structure disposed between, and extending along a direction parallel to, the first gate structure and the second gate structure, where the fin isolation structure provides isolation between the first transistor and the second transistor, and an entirety of a bottom surface of the fin isolation structure is in direct contact with the substrate.

In some embodiments, the semiconductor structure may also include a first gate isolation structure and a second gate isolation structure, where the each of the first gate structure, the second gate structure, and the fin isolation structure may be in direct contact with both the first gate isolation structure and the second gate isolation structure. In some embodiments, a bottom surface of the fin isolation structure may be below a bottom surface of the first gate isolation structure, and the bottom surface of the first gate isolation structure may be below a bottom surface of the isolation feature. In some embodiments, the first fin may be aligned with the third fin, and the second fin may be aligned with the fourth fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a workpiece comprising:

a first semiconductor fin and a second semiconductor fin separated by a first isolation feature over a substrate, and a gate structure comprising a first portion intersecting the first semiconductor fin and the second semiconductor fin and disposed directly over the first isolation feature, wherein the first portion of the gate structure comprises a gate dielectric layer and a gate electrode over the gate dielectric layer;

performing a first etching process to the workpiece, thereby exposing a top surface of the gate electrode;

performing a second etching process to selectively remove a part of the first portion of the gate structure, wherein, after the performing of the second etching process, the gate electrode extends over the first isolation feature;

performing a third etching process to remove remaining parts of the first portion of the gate structure, the first and second semiconductor fin, and the first isolation feature under the first portion of the gate structure, thereby forming a fin isolation trench;

forming a dielectric layer over the workpiece to substantially fill the fin isolation trench; and planarizing the dielectric layer to form a fin isolation structure in the fin isolation trench, wherein a bottom surface of the fin isolation structure is lower than a bottommost portion of the gate structure and is lower than a bottommost portion of the first isolation feature.

2. The method of claim 1, wherein the workpiece further comprises a first source/drain feature spanning over both the first semiconductor fin and the second semiconductor fin, and a second source/drain feature spanning over both the first semiconductor fin and the second semiconductor fin, wherein the fin isolation structure is disposed between the first source/drain feature and the second source/drain feature.

3. The method of claim 1, wherein the first semiconductor fin and the second semiconductor fin each extends lengthwise along a first direction, the gate structure extends lengthwise along a second direction that is substantially perpendicular to the first direction, and the fin isolation structure extends lengthwise along the second direction.

4. The method of claim 3, further comprising:

forming a first gate isolation structure extending through the gate structure and disposed adjacent to the first semiconductor fin; and forming a second gate isolation structure extending through the gate structure and disposed adjacent to the second semiconductor fin, wherein the fin isolation structure is disposed between the first gate isolation structure and the second gate isolation structure along the second direction.

5. The method of claim 4, wherein the fin isolation structure is in direct contact with both the first gate isolation structure and the second gate isolation structure.

6. The method of claim 4, wherein a thickness of the fin isolation structure is greater than a thickness of the first gate isolation structure.

7. The method of claim 4, wherein the forming of the first gate isolation structure and the second gate isolation structure comprises:

forming a first trench extending through the gate structure and adjacent to the first semiconductor fin and a second trench extending through the gate structure and adjacent to the second semiconductor fin;

depositing a dielectric material layer over the workpiece to substantially fill the first trench and the second trench; and etching back the dielectric material layer, thereby forming the first gate isolation structure in the first trench and the second gate isolation structure in the second trench.

8. The method of claim 1, wherein the workpiece further comprises a third semiconductor fin penetrating from the substrate, wherein the gate structure further comprises a second portion wraps over the third semiconductor fin, wherein the method further comprises:

after the forming of the fin isolation structure in the fin isolation trench, replacing the second portion of the gate structure with a gate stack, wherein the gate stack comprises a high-k dielectric layer and a work function layer disposed over the high-k dielectric layer.

9. A method, comprising:

receiving a workpiece comprising:

a plurality of fins extending lengthwise along a first direction and over a substrate, a plurality of isolation features, wherein two adjacent fins of the plurality of fins are separated by a respective isolation feature of the plurality of isolation features, and a gate structure extending lengthwise along a second direction and directly over the plurality of fins and the plurality of isolation features, the second direction being substantially perpendicular to the first direction;

forming a first trench and a second trench to separate the gate structure into a first portion, a second portion, and a third portion, wherein the first portion is separated from the second portion and the third portion by the first trench and the second trench, respectively;

forming a first isolation structure and a second isolation structure in the first trench and the second trench, respectively;

after the forming of the first isolation structure and the second isolation structure, selectively recessing the first portion of the gate structure, wherein, in a cross-sectional view cut through the plurality of fins, a top surface of the recessed first portion of the gate structure is planar and over top surfaces of the plurality of fins;

after the selectively recessing, selectively removing remaining parts of the first portion of the gate structure, portions of the plurality of fins and portions of the plurality of isolation features disposed directly under the first portion of the gate structure to form a third trench; and forming a third isolation structure in the third trench.

10. The method of claim 9, wherein the first portion of the gate structure is disposed directly over multiple fins of the plurality of fins.

11. The method of claim 9, wherein a thickness of the third isolation structure is greater than a thickness of the first isolation structure.

12. The method of claim 9, wherein the forming of the first trench and the second trench comprises:

depositing a first dielectric layer over the workpiece;

depositing a material layer over the first dielectric layer, wherein a composition of the material layer is different from a composition of the first dielectric layer;

depositing a hard mask layer over the material layer;

patterning the hard mask layer, the material layer, and the first dielectric layer to form a first opening and a second opening; and performing a first etching process to selectively remove portions of the gate structure exposed by the first opening and the second opening to form the first trench and the second trench.

13. The method of claim 12, wherein each of the first trench and the second trench extend through portions of the plurality of isolation features and extend into the substrate.

14. The method of claim 12, further comprising:

after the forming of the first isolation structure and the second isolation structure, forming a patterned mask film over the workpiece, wherein the patterned mask film comprises a third opening, wherein the third openings is directly over the first portion of the gate structure and further exposes both the first isolation structure and the second isolation structure; and performing a second etching process to remove portions of the hard mask layer, the material layer, and the first dielectric layer disposed directly over the first portion of the gate structure to expose the first portion of the gate structure.

15. The method of claim 14, wherein the gate structure is a first gate structure, the workpiece further comprises a second gate structure extending lengthwise along the second direction and disposed adjacent to the first gate structure, wherein the first isolation structure and the second isolation structure further cut the second gate structure into three segments.

16. A semiconductor structure, comprising:

a first transistor comprising:

a first fin and a second fin protruding from a substrate and spaced apart by an isolation feature;

a first gate structure over channel regions of the first fin and the second fin, wherein the first gate structure comprises a high-k dielectric layer and a gate electrode over the high-k dielectric layer, wherein the first gate structure extends lengthwise along a first direction; and a first source/drain feature disposed and spanning over the first fin and the second fin;

a second transistor comprising:

a third fin and a fourth fin protruding from the substrate and spaced apart by the isolation feature;

a second gate structure over channel regions of the third fin and the fourth fin; and a second source/drain feature disposed and spanning over the third fin and the fourth fin;

a first gate isolation structure and a second gate isolation structure each extending lengthwise along a second direction different from the first direction, wherein each of the first and second gate structures extends between the first and second gate isolation structures, and bottom surfaces of the first and second gate isolation structures are below bottom surfaces of the first and second gate structures; and a fin isolation structure disposed between the first gate structure and the second gate structure in the second direction and between the first and second gate isolation structures in the first direction, wherein the fin isolation structure provides isolation between the first transistor and the second transistor, and wherein in a cross-sectional view cut through the fin isolation structure and the first and second gate isolation structures, an entirety of a bottom surface of the fin isolation structure is planar and under a bottom surface of the first gate isolation structure.

17. The semiconductor structure of claim 16, wherein the bottom surface of the first gate isolation structure is below a bottom surface of the isolation feature.

18. The semiconductor structure of claim 16, wherein the first fin is aligned with the third fin, and the second fin is aligned with the fourth fin.

19. The method of claim 1, wherein, after the performing of the second etching process, in a cross-sectional view, the top surface of the gate electrode is coplanar with a top surface of the gate dielectric layer.

20. The semiconductor structure of claim 16, wherein the isolation feature is a first isolation feature, wherein the semiconductor structure further comprises a second isolation feature, the first fin is disposed between the first isolation feature and the second isolation feature, and the first gate isolation structure extends into the second isolation feature, and wherein a thickness of the first isolation feature is less than a thickness of the second isolation feature.

* * * * *